US012765091B2

(12) United States Patent
Park et al.

(10) Patent No.: US 12,765,091 B2
(45) Date of Patent: Oct. 13, 2026

(54) IMAGE SENSOR AND MANUFACTURING METHOD THEREOF

(71) Applicant: SAMSUNG ELECTRONICS CO., LTD., Suwon-si (KR)

(72) Inventors: Gyunha Park, Suwon-si (KR); Jonghyun Go, Suwon-si (KR); Ji-Youn Song, Suwon-si (KR); Keun Yeong Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 355 days.

(21) Appl. No.: 18/407,163

(22) Filed: Jan. 8, 2024

(65) Prior Publication Data

US 2024/0405037 A1 Dec. 5, 2024

(30) Foreign Application Priority Data

Jun. 5, 2023 (KR) ........................ 10-2023-0072430

(51) Int. Cl.
*H10F 39/00* (2025.01)

(52) U.S. Cl.
CPC ....... *H10F 39/8037* (2025.01); *H10F 39/026* (2025.01); *H10F 39/811* (2025.01)

(58) Field of Classification Search
CPC ... H10F 39/8037; H10F 39/026; H10F 39/811
See application file for complete search history.

(56) References Cited

U.S. PATENT DOCUMENTS

| | | | | |
|---|---|---|---|---|
| 9,935,037 | B2 | 4/2018 | Kang et al. | |
| 10,453,888 | B2 | 10/2019 | Kobayashi | |
| 2022/0150431 | A1 * | 5/2022 | Kurobe | H10F 39/8037 |
| 2022/0367552 | A1 | 11/2022 | Kitano | |
| 2022/0384207 | A1 | 12/2022 | Haneda et al. | |
| 2023/0049255 | A1 | 2/2023 | Yang et al. | |
| 2023/0326945 | A1 * | 10/2023 | Kim | H04N 25/772 |

FOREIGN PATENT DOCUMENTS

| | | |
|---|---|---|
| KR | 10-2017-0086924 | 7/2017 |
| KR | 10-2022-0025812 | 3/2022 |
| KR | 10-2022-0101089 | 7/2022 |
| WO | WO 2022/265059 | 12/2022 |

* cited by examiner

*Primary Examiner* — Richard A Booth
(74) *Attorney, Agent, or Firm* — Fish & Richardson P.C.

(57) ABSTRACT

The present disclosure relates to image sensors. An example image sensor includes a first substrate, a transmission transistor, a second substrate, multiple transistors, multiple wires, and a deep node. The first substrate includes a first side, a second side facing the first side, and a photoelectric conversion area. The transmission transistor is disposed on the first side of the first substrate. The second substrate includes a first side and a second side facing each other. The transistors are disposed on the first side of the second substrate and connected with the transmission transistor. The wires are disposed on the second side of the second substrate. The deep node penetrates the second substrate. The first side of the first substrate and the first side of the second substrate face each other. The transistors and one or more wires are connected through the deep node.

20 Claims, 21 Drawing Sheets

IMAGE SENSOR AND MANUFACTURING METHOD THEREOF

CROSS-REFERENCE TO RELATED APPLICATION

This application claims priority to and the benefit of Korean Patent Application No. 10-2023-0072430 filed in the Korean Intellectual Property Office on Jun. 5, 2023, the entire contents of which are incorporated herein by reference.

BACKGROUND

An image sensor is a semiconductor device that converts an optical image into an electrical signal. The image sensor may be classified into a charge coupled device (CCD) type and a complementary metal oxide semiconductor (CMOS) type. The CMOS-type image sensor is abbreviated as CIS (CMOS image sensor). The CIS includes a plurality of pixels that are two-dimensionally arranged. Each of the pixels includes a photodiode (PD). The photodiode serves to convert incident light into an electrical signal.

Recently, an image sensor in which a semiconductor wafer including a plurality of pixels and a semiconductor wafer including a transistor for reading signal charge of a charge accumulator are stacked has been proposed.

SUMMARY

The present disclosure relates to image sensors, including an image sensor that can reduce coupling between a floating diffusion area and wiring and has improved efficiency, and manufacturing methods thereof.

In some implementations, an image sensor includes: a first substrate that includes a first side and a second side facing each other, and a photoelectric conversion area; a transmission transistor that is disposed on the first side of the first substrate; a second substrate that includes a first side and a second side facing each other; a plurality of transistors that are disposed on the first side of the second substrate and connected with the transmission transistor; a plurality of wires that are disposed on the second side of the second substrate; and a deep node that penetrates the second substrate, wherein the first side of the first substrate and the first side of the second substrate face each other, and the plurality of transistors disposed on the first side of the second substrate and one or more of the plurality of wires disposed on the second side of the second substrate are connected through the deep node.

In some implementations, the image sensor further includes a floating diffusion area that is disposed on the first substrate and connects the transmission transistor and the plurality of transistors, wherein the plurality of transistors disposed on the second substrate may include: a reset transistor that initializes the floating diffusion area; an amplification transistor of which a gate is connected with the floating diffusion area; and a selection transistor connected with one end of the amplification transistor.

The plurality of wires may include an output wire connected to one end of the selection transistor, and the output wire and the selection transistor may be connected through the deep node.

The plurality of wires may include a power voltage transmission wire connected with one end of the reset transistor, and the power voltage transmission wire and the reset transistor may be connected through the deep node.

The plurality of wires may include a power voltage transmission wire connected to one end of the amplification transistor, and the power voltage transmission wire and the amplification transistor may be connected through the deep node.

The plurality of wires may include a wire connected with a gate of the reset transistor, and the gate of the reset transistor and the wire may be connected through the deep node.

The plurality of wires may include a wire connected with a gate of the selection transistor, and the gate of the transistor and the wire may be connected through the deep node.

In some implementations, the image sensor further includes a dual conversion transistor that connects the reset transistor and the floating diffusion area, wherein the plurality of wires may include a wire connected with a gate of the dual conversion transistor, and the dual conversion transistor and the wire may be connected through the deep node.

One end of the deep node may be disposed while protruding from the first side of the second substrate, and the other end of the deep node may be disposed while protruding from the second side of the second substrate.

In some implementations, the image sensor includes a first floating diffusion area connection node disposed on the first substrate, wherein the image sensor may include a plurality of pixels, one of the pixels may include eight photoelectric conversion area and eight transmission transistors, and the eight transmission transistors may be connected with the same first floating diffusion area connection node.

In some implementations, an image sensor includes: a first substrate that includes a first side and a second side facing each other, and a photoelectric conversion area; a light transmission layer disposed on the second side of the first substrate; a transmission transistor disposed on the first side of the first substrate; a first wiring area disposed on the first side of the first substrate; a second substrate that includes a first side and a second side facing each other; a plurality of transistors that is disposed on the first side of the second substrate and connected with the transmission transistor; a second wiring area that is disposed on the second substrate; a third wiring area that is disposed on the second side of the second substrate; and a deep node that penetrates the second substrate, wherein the side of the first substrate and the first side of the second substrate face each other, and some of the wirings disposed in the second wiring area and some wirings disposed in the third wiring area are connected through the deep node.

One end of the deep node may be disposed while protruding from the first side of the second substrate, and the other end of the deep node may be disposed while protruding from the second side of the second substrate.

In some implementations, the image sensor further includes a third substrate including a first side and a second side facing each other, wherein the first side of the third substrate may face the second side of the second substrate, and the image sensor may further include a plurality of transistors disposed on the first side of the third substrate and a fourth wiring area disposed on the first side of the third substrate.

A signal transmitted to the wire disposed in the third wiring area may be transmitted to the plurality of transistors disposed in the first side of the second substrate through the deep node and the wire disposed in the second wiring area.

In some implementations, a manufacturing method of an image sensor includes: preparing a first substrate that includes a first side and a second side facing each other, and a transmission transistor and a first wiring area disposed on the first side; preparing a second substrate that includes a first side and a second side facing each other, and a plurality of transistors and a second wiring area disposed on the first side; bonding the first substrate and the second substrate such that the first side of the first substrate and the first side of the second substrate face each other; forming a deep node that penetrates the second substrate in a direction facing the first side of the second substrate from the second side of the second substrate; and forming a third wiring area on the second side of the second substrate, wherein some of the wirings disposed in the second wiring area and some of the wirings disposed in the third wiring area connected with each other through the deep node.

In the forming the deep node that penetrates the second substrate in a direction facing the first side of the second substrate from the second side of the second substrate, one end of the deep node may be disposed while protruding from the first side of the second substrate, and the other end of the deep node may be disposed while protruding from the second side of the second substrate.

In the forming the deep node that penetrates the second substrate from the second side of the second substrate, the wire disposed in the second wiring area may serve as an etch stopper.

In some implementations, the manufacturing method of the image sensor further includes: preparing a third substrate that includes a first side and a second side facing each other, and a plurality of transistors and a fourth wiring area disposed on the first side; and bonding the second side of the second substrate and the first side of the third substrate to face each other.

The first substrate may further include a photoelectric conversion area and a floating diffusion area connecting the transmission transistor and the plurality of transistors, the plurality of transistors disposed on the second substrate may include: a reset transistor initializing the floating diffusion area; an amplification transistor of which a gate is connected with the floating diffusion area; and a selection transistor connected with one end of the amplification transistor, wherein one or more of wires connected with the reset transistor, the amplification transistor, and the selection transistor are formed in the third wiring area.

In some implementations, the manufacturing method of the image sensor further includes: a first floating diffusion area connection node disposed in the first wiring area; and a second floating diffusion area connection node connected in the second wiring area, wherein in the bonding the second side of the second substrate and the first side of the third substrate to face each other, and the first floating diffusion area connection node and the second floating diffusion area connection node directly contact each other.

According to some implementations, an image sensor that has improved efficiency and can reduce coupling between a floating diffusion area and wiring, and a manufacturing method thereof are provided.

DETAILED DESCRIPTION

Figure 1:
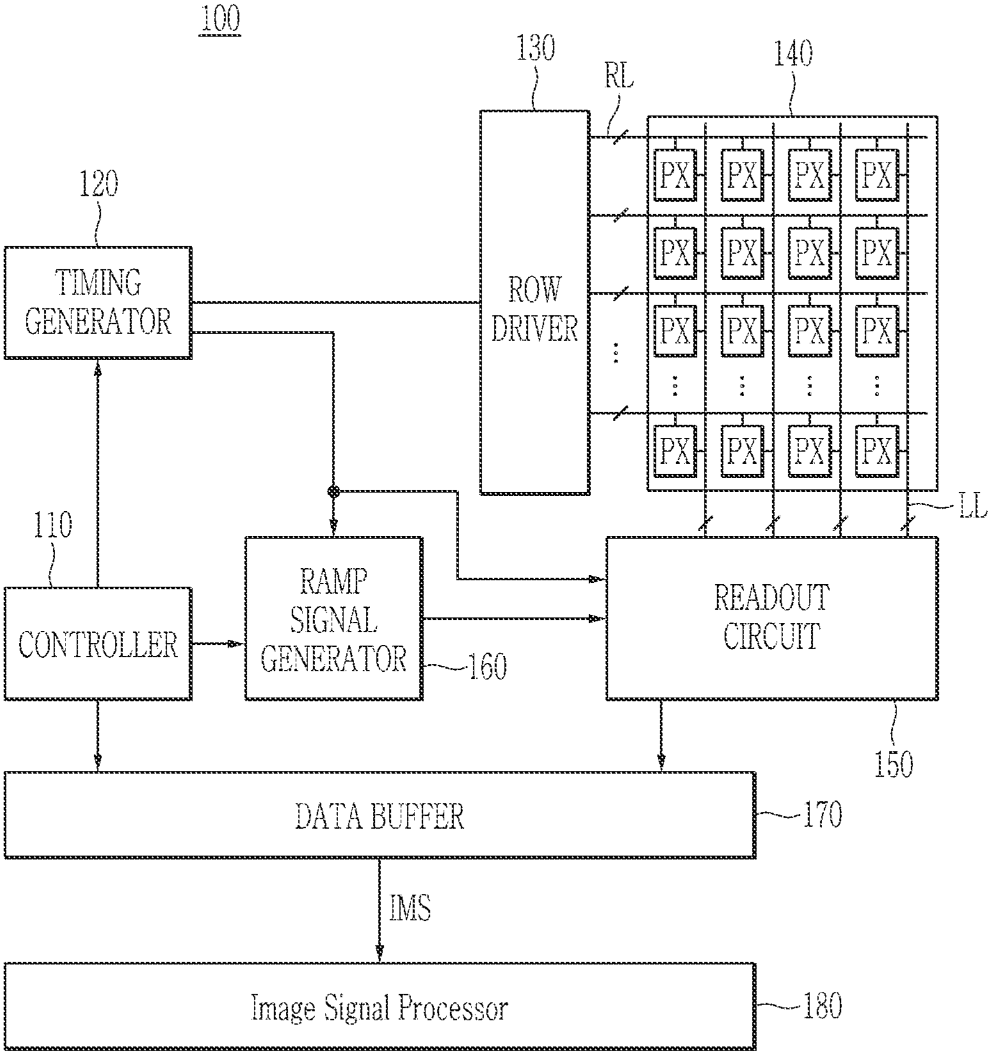
FIG. 1 is a block diagram of an example image sensor.

Hereinafter, various implementations of the present disclosure will be described in detail with reference to the accompanying drawing, and thus a person of an ordinary skill can easily perform it in the technical field to which the present disclosure belongs. The present disclosure may be implemented in several different forms and is not limited to the implementations described herein.

In order to clearly explain the present disclosure, parts irrelevant to the description are omitted, and the same reference sign is designated to the same or similar constituent elements throughout the specification.

In addition, since the size and thickness of each component shown in the drawing are arbitrarily indicated for better understanding and ease of description, the present disclosure is not necessarily limited to the drawings. In the drawings, the thickness of layers, films, panels, regions, etc., are exaggerated for clarity. In addition, in the drawing, for convenience of explanation, the thickness of some layers and regions is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" or "above" a target element will be understood to mean positioned above or below the target element, and will not necessarily be understood to mean positioned "on" or "above" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

FIG. 1 is a block diagram of an example image sensor.

Referring to FIG. 1, an image sensor 100 includes a controller 110, a timing generator 120, a row driver 130, a pixel array 140, a readout circuit 150, a ramp signal generator 160, a data buffer 170, and an image signal processor 180. In some implementations, the image signal processor 180 may be disposed outside the image sensor 100.

The image sensor 100 may generate an image signal by converting externally received light to an electrical signal. An image signal IMS may be provided to the image signal processor 180.

The image sensor 100 may be mounted on an electronic device having an image or optical sensing function. For example, the image sensor 100 may be mounted on an electronic device such as a camera, a smartphone, a wearable device, an Internet of Things (IOT) device, a home appliance, a tablet personal computer (PC), a personal digital assistant (PDA), a portable multimedia player (PMP), a navigation, a drone, and an advanced driver assistance system (ADAS). Alternatively, the image sensor 100 may be mounted on an electronic device provided as a component in vehicles, furniture, manufacturing facilities, doors, and various measuring devices.

The controller 110 may overall control constituent elements 120, 130, 150, 160, and 170 included in the image sensor 100. The controller 110 may control operation timing of each of the constituent elements 120, 130, 150, 160, and 170 using control signals. In some implementations, the controller 110 may receive a mode signal indicating an imaging mode from an application processor, and overall control the image sensor 100 based on the received mode signal. For example, the application processor may determine the imaging mode of the image sensor 100 according to various scenarios such as illumination of the imaging environment, user's resolution setting, sensing or learned state, and provide the determined result to the controller 110 as a mode signal. The controller 110 may control a plurality of pixels of a pixel array 140 to output pixel signals according to an imaging mode, the pixel array 140 may output pixel signals for each of the plurality of pixels or pixel signals for some of the plurality of pixels, and the readout circuit 150 may sample and process pixel signals received from the pixel array 140. The timing generator 120 may generate a signal that serves as the basis for the operation timing of components of the image sensor 100.

The timing generator 120 may control timing of the row driver 130, the readout circuit 150, and the ramp signal generator 160. The timing generator 120 may provide a control signal for controlling the timing of the row driver 130, the readout circuit 150, and the ramp signal generator 160.

The pixel array 140 may include a plurality of pixels PX, and a plurality of row lines RL and a plurality of column lines LL respectively connected to the plurality of pixels PX. In some implementations, each pixel PX may include at least one or more photoelectric conversion elements. The photoelectric conversion element may sense incident light and convert the incident light into an electrical signal according to an amount of light, that is, a plurality of analog pixel signals. The photoelectric conversion element may be a photodiode or a pinned diode. In addition, the photoelectric conversion element may be a single-photon avalanche diode (SPAD) applied to a 3D sensor. A level of the analog pixel signal output from the photoelectric conversion element may be proportional to the amount of charges output from the photoelectric conversion element. That is, the level of the analog pixel signal output from the photoelectric conversion element may be determined according to the amount of light received into the pixel array 140.

A plurality of row lines RL extends in a first direction and may be connected to pixels PX disposed along the first direction. For example, a control signal output to a row line RL from the row driver 130 may be transmitted to a gate of a transistor of a plurality of pixels PX connected to the corresponding row line RL. Column lines LL may extend in a second direction that crosses the first direction, and may be connected with pixels PX arranged along the second direction. A plurality of pixel signals output from the plurality of pixels PX may be transmitted to the readout circuit 150 through the plurality of column lines LL.

A color filter layer and a micro lens layer may be disposed on the pixel array 140. The micro lens layer includes a plurality of micro lens, and each of the plurality of micro lens may be disposed above at least one corresponding pixel PX. The color filter layer includes color filters such as red, green, and blue, and may additionally include a white filter. For one pixel PX, a color filter of one color may be disposed between the pixel PX and the corresponding micro lens. Detailed structures of the color filter layer and the micro lens layer will be described later with reference to FIG. 4.

The row driver 130 generates a control signal for driving the pixel array 140 responding to the control signal of the timing generator 120, and may provide the control signal to the plurality of pixels PX of the pixel array 140 through the plurality of row lines RL. In some implementations, the row driver 130 may control the pixel PX to sense incident light in a row line unit. A row line unit may contain at least one row line RL. For example, the row driver 130 may provide a transmission signal TS, a reset signal RS, and a selection signal SEL to the pixel array 140 as described later.

In response to the control signal from the timing generator 120, the readout circuit 150 may convert a pixel signal (or electrical signal) from the pixels PX connected to the row lines RL selected from among the plurality of pixel PXs into a pixel value representing the amount of light. The readout circuit 150 may convert a pixel signal output through the corresponding column lines LL into a pixel value. For example, the readout circuit 150 may convert a pixel signal into a pixel value by comparing a ramp signal and a pixel signal. A pixel value may be image data having a plurality of bits. Specifically, the readout circuit 150 may include a selector, a plurality of comparators, and a plurality of counter circuits.

The ramp signal generator 160 may generate a reference signal and transmit it to the readout circuit 150.

The ramp signal generator 160 may include a current source, a resistor, and a capacitor. The ramp signal generator 160 adjusts a ramp voltage, which is a voltage at the ramp resistor by adjusting the current intensity of a variable current source or a resistance value of the variable resistor to thereby generate a plurality of ramp signals that fall or rise with a slope determined according to the current intensity of the variable current source or the resistance value of the variable resistor.

The data buffer 170 stores a pixel value of a plurality of pixels PX connected to a selected column line LL transmitted from the readout circuit 150, and may output the stored pixel value responding to an enable signal from the controller 110.

The image signal processor 180 may perform an image signal process with respect to the image signal received from the data buffer 170. For example, the image signal processor 180 receives a plurality of image signals from the data buffer 170, and may generate a single image by combining received image signals.

In some implementations, a plurality of pixels may be grouped in the form of M*N (M and N are integers greater than or equal to 2) to form one unit pixel group. The M*N form may be a form in which M pixels are arranged in an arrangement direction of the column lines LL and N pixels are arranged in an arrangement direction of row lines RL. For example, one unit pixel group may include a plurality of pixels arranged in a 2*2 form, and one unit pixel group may output one analog pixel signal. An implementation below is not limited to one pixel and may be applied to a unit pixel group.

Figure 2:
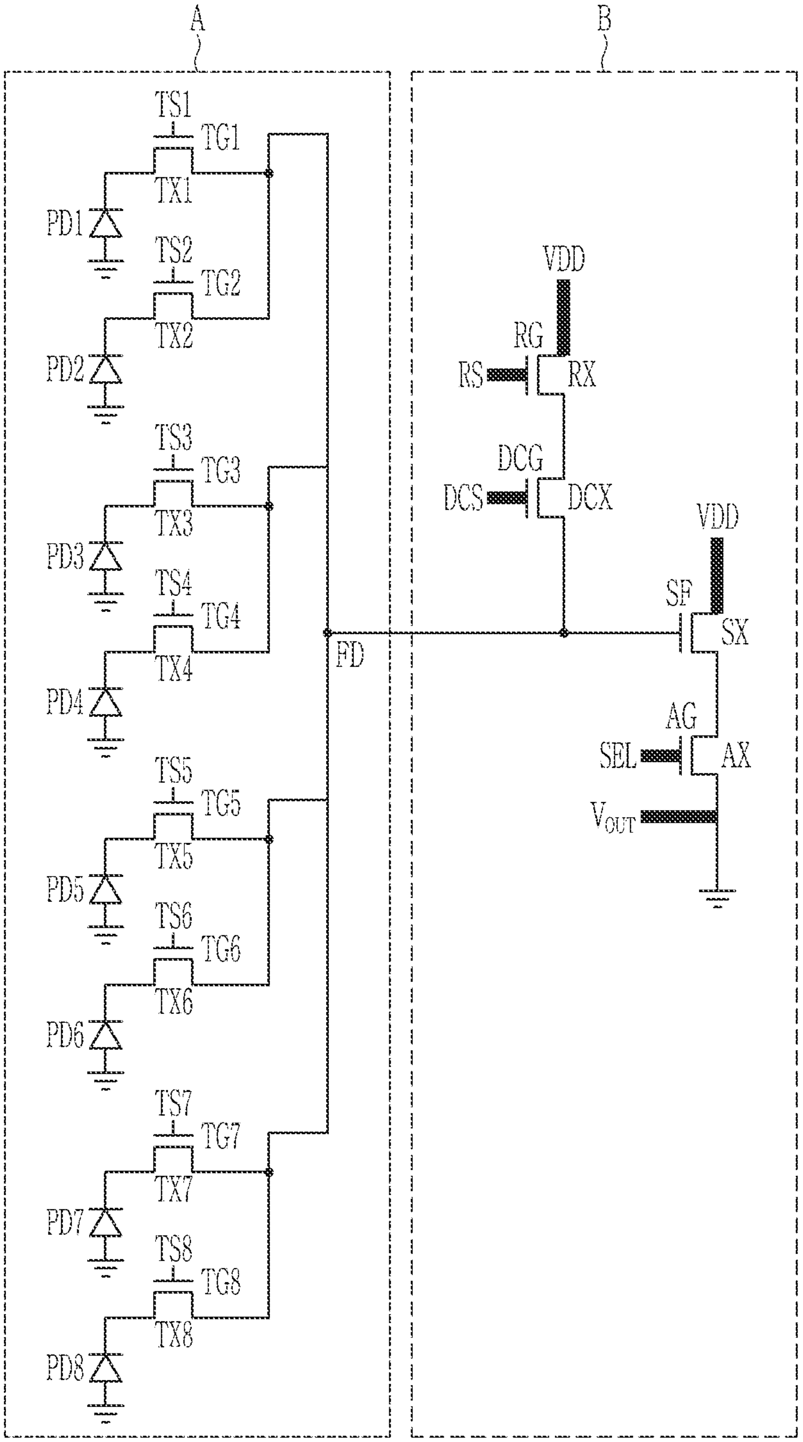
FIG. 2 is a circuit diagram of a pixel included in an example image sensor.

FIG. 2 is a circuit diagram of a pixel included in an example image sensor.

Referring to FIG. 2, one pixel may include a plurality of photoelectric conversion elements PD1, PD2, PD3, PD4, PD5, PD6, PD7, and PD8. The respective photoelectric conversion elements PD1, PD2, PD3, PD4, PD5, PD6, PD7, and PD8 may perform photoelectric conversion. As shown in FIG. 2, the plurality of photoelectric conversion elements PD1, PD2, PD3, PD4, PD5, PD6, PD7, and PD8 may be connected to one floating diffusion area FD. In FIG. 2, eight photoelectric conversion elements connected to one floating diffusion area FD have been described, but this is only an example, and the number of photoelectric conversion elements connected to one floating diffusion area FD may vary depending on implementations.

Hereinafter, a first photoelectric conversion element PD1 will be mainly described, but the following description is equally applicable to other photoelectric conversion elements PD2, PD3, PD4, PD5, PD6, PD7, and PD8.

The first photoelectric conversion element PD1 may generate and accumulate charge according to the amount of light received. The first photoelectric conversion element PD1 may include an anode connected to the ground and a cathode connected to one end of a first transmission transistor TX1. A first transmission signal TS1 is supplied to a gate TG1 of the first transmission transistor TX1, and one end of the first transmission transistor TX1 may be connected to the floating diffusion area FD. When the first transmission transistor TX1 is turned on by the first transmission signal TS1, the charge charged in the first photoelectric conversion element PD1 may be transmitted to the floating diffusion area FD. The floating diffusion area FD may retain charge transmitted from the photoelectric conversion element PD.

Each of the plurality of transmission transistors TX1, TX2, TX3, TX4, TX5, TX6, TX7, and TX8 may be connected between one of the plurality of photoelectric conversion elements PD1, PD2, PD3, PD4, PD5, PD6, PD7, and PD8 and the floating diffusion area FD, and may include a gate electrodes TG1, TG2, TG3, TG4, TG5, TG6, TG7, and TG8 receiving a plurality of transmission signals TS1, TS2, TS3, TS4, TS5, TS6, TS7, and TS8. For example, the first transmission transistor TX1 may be connected between the first photoelectric conversion element PD1 and the floating diffusion area FD, and may include a gate electrode TG1 receiving the first transmission signal TS1. The number of plurality of transmission transistors TX1, TX2, TX3, TX4, TX5, TX6, TX7, and TX8 may be equal to the number of plurality of photoelectric conversion elements PD1, PD2, PD3, PD4, PD5, PD6, PD7, and PD8.

The reset transistor RX may be connected between a gate electrode RG connected between a power voltage VDD and the floating diffusion area FD, and may receive a reset signal RS.

The reset transistor RX may periodically reset the charges accumulated in the floating diffusion area FD. A drain electrode of the reset transistor RX is connected to a source electrode of a dual conversion transistor DCX, and the source electrode may be connected to the power voltage VDD. When the reset transistor RX is turned on, the power voltage VDD connected to the source electrode of the reset transistor RX may be applied to the floating diffusion area FD. Therefore, when the reset transistor RX is turned on, the charges accumulated in the floating diffusion area FD are discharged such that the floating diffusion area FD can be reset.

The dual conversion transistor DCX may be disposed between a gate electrode DCG disposed between the reset transistor RX and the floating diffusion area FD, and may receive the dual conversion signal DCS. The dual conversion transistor DCX may reset the floating diffusion area FD together with the reset transistor RX.

The drain electrode of the dual conversion transistor DCX is connected to the floating diffusion area FD, and a source electrode of the dual conversion transistor DCX may be connected to a drain electrode of the reset transistor RX. When the reset transistor RX and the dual conversion transistor DCX are turned on, the power voltage VDD connected with the source electrode of the reset transistor RX may pass through the dual conversion transistor DCX and be applied to the floating diffusion area FD. Therefore, charges accumulated in the floating diffusion area FD are discharged and the floating diffusion area FD can be reset.

An amplification transistor SX may output a pixel signal according to a voltage of the floating diffusion area FD. A gate SF of the amplification transistor SX is connected to the floating diffusion area FD, the power voltage VDD may be supplied to a source electrode of the amplification transistor SX, and a drain electrode of the amplification transistor SX may be connected to one end of a selection transistor AX. The amplification transistor SX may form a source follower circuit and may output a voltage at a level corresponding to the charge accumulated in the floating diffusion area FD as a pixel signal.

When the selection transistor AX is turned on by the selection signal SEL, a pixel signal from the amplification transistor SX may be transmitted to the readout circuit. The selection signal SEL may be applied to a gate electrode AG of the selection transistor AX, and a drain electrode of the selection transistor AX may be connected with an output wire Vout outputting a plurality of pixel signals.

An operation of the image sensor will be described with reference to FIG. 2. First, while light is blocked, the power voltage VDD is applied to the drain electrode of the reset transistor RX and the drain electrode of the amplification transistor SX and the reset transistor RX and the dual conversion transistor DCX are turned on to discharge residual charges in the floating diffusion area FD. After that, the reset transistor RX is turned off, and light from the outside is incident on the photoelectric conversion elements PD1, PD2, PD3, PD4, PD5, PD6, PD7, and PD8 such that electron-hole pairs are generated respectively from the photoelectric conversion elements PD1, PD2, PD3, PD4, PD5, PD6, PD7, and PD8. Holes are moved to and accumulated in p-type impurity regions of photoelectric conversion elements PD1, PD2, PD3, PD4, PD5, PD6, PD7, and PD8, and electrons are moved to and accumulated in n-type impurity regions. When the transmission transistors TX1, TX2, TX3, TX4, TX5, TX6, TX7, TX8 are turned on, the charges such as electrons and holes are transmitted to the floating diffusion area FD and accumulated. A gate bias of the amplification transistor SX changes in proportion to the accumulated charge, resulting in a change in the source potential of the amplification transistor SX. In this case, when the selection transistor AX is turned on, the signal is read by charge through the output wire Vout.

A wire may be electrically connected to at least one of gate electrodes TG1, TG2, TG3, TG4, TG5, TG6, TG7, and TG8 of the transmission transistors TX1, TX2, TX3, TX5, TX6, TX7, and TX8, the gate electrode SF of the amplification transistor SX, the gate electrode DCG of the dual conversion transistor DCX, the gate electrode RG of the reset transistor RX, and the gate electrode AG of the selection transistor AX. The wire may include a power voltage transmission wire that applies the power voltage VDD to the source electrode of the reset transistor RX or the source electrode of the amplification transistor SX. The wire may include an output wire Vout connected to the selection transistor AX.

Although it will be described separately in detail later in FIG. 4, the image sensor may include a first chip 1000, a second chip 2000, and a third chip 3000. In this case, the portion marked by A in the circuit diagram of FIG. 2 may be positioned in the first chip 1000, and the portion marked by B may be positioned in the second chip 2000. The floating diffusion area FD of the first chip 1000 may be connected with the second chip 2000 through floating diffusion area connection nodes FDCN_1 and FDCN_2, and a detailed connection structure will be described later.

In the portion marked by B in FIG. 2, some wires connected with the transistor are shown in bold. Specifically, a power voltage transmission wire transmitting a power voltage VDD to the reset transistor RX and the amplification transistor SX, a wire connected with the gate electrode RG of the reset transistor RX and transmitting a reset signal RS, a wire connected with the gate electrode DCG of the dual conversion transistor DCX and transmitting a dual conversion signal DCS, a wire connected with the gate electrode AG of the selection transistor AX and transmitting a selection signal SEL, and an output wire Vout connected with a drain electrode AG of the selection transistor AX are bolded. One or more of the wirings shown in bold may be disposed on a different side from gate electrodes RG, DCG, SF, and SELG of the respective transistors RX, DCX, SX, and AX. After that, although it will be described in detail with reference to FIG. 4, the respective transistors RX, DCX, SX, and AX are disposed on a first side 500*a* of the second substrate 500 included in the second chip 2000, and one or more wires connected with the respective transistors RX, DCX, SX, and AX may be disposed on a second side 500*b* of the second substrate 500 of the second substrate 500. The respective transistors RX, DCX, SX, and AX and the wires may be connected through a deep node DN that penetrates the second substrate 500. In the image sensor having such a structure, a length to which the floating diffusion area FD is connected between the first chip 1000 and the second chip 2000 is shortened, thereby including a conversion gain CG and reducing coupling between the floating diffusion area FD and the wiring. A detailed effect will be described separately later.

Figure 3:
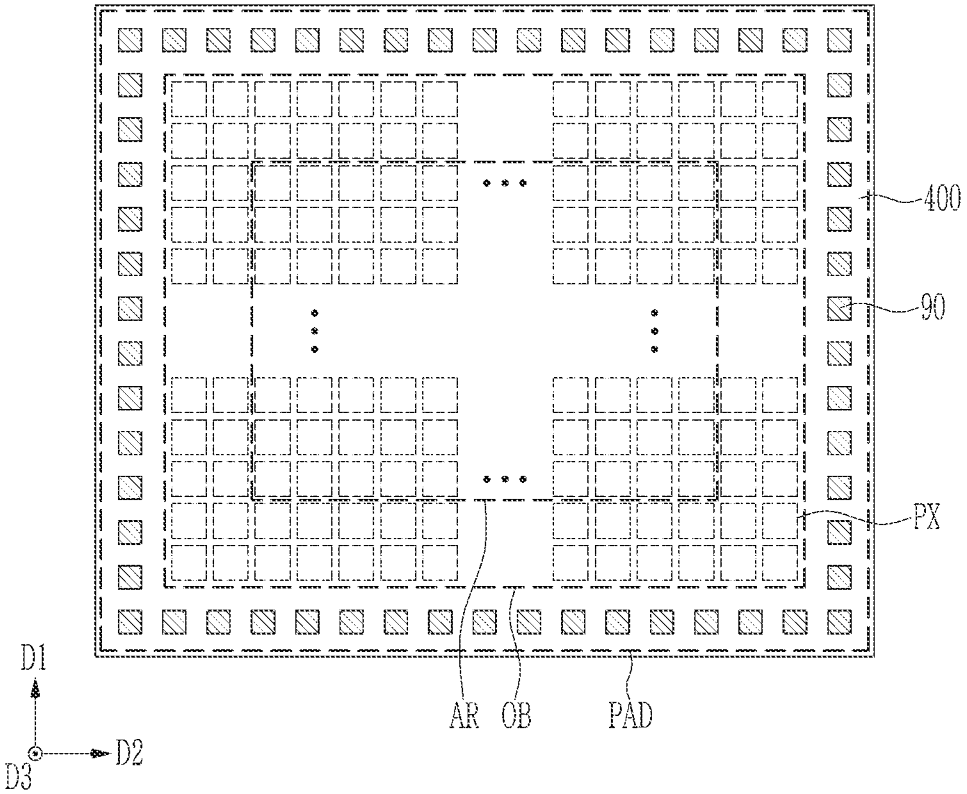
FIG. 3 is a top plan view of an example image sensor.

FIG. 3 is a top plan view of an example image sensor. FIG. 4 is a partial cross-sectional view of one pixel PX of an example image sensor. However, the description in FIG. 3 and FIG. 4 is only an example, and the present disclosure is not limited thereto.

Figure 4:
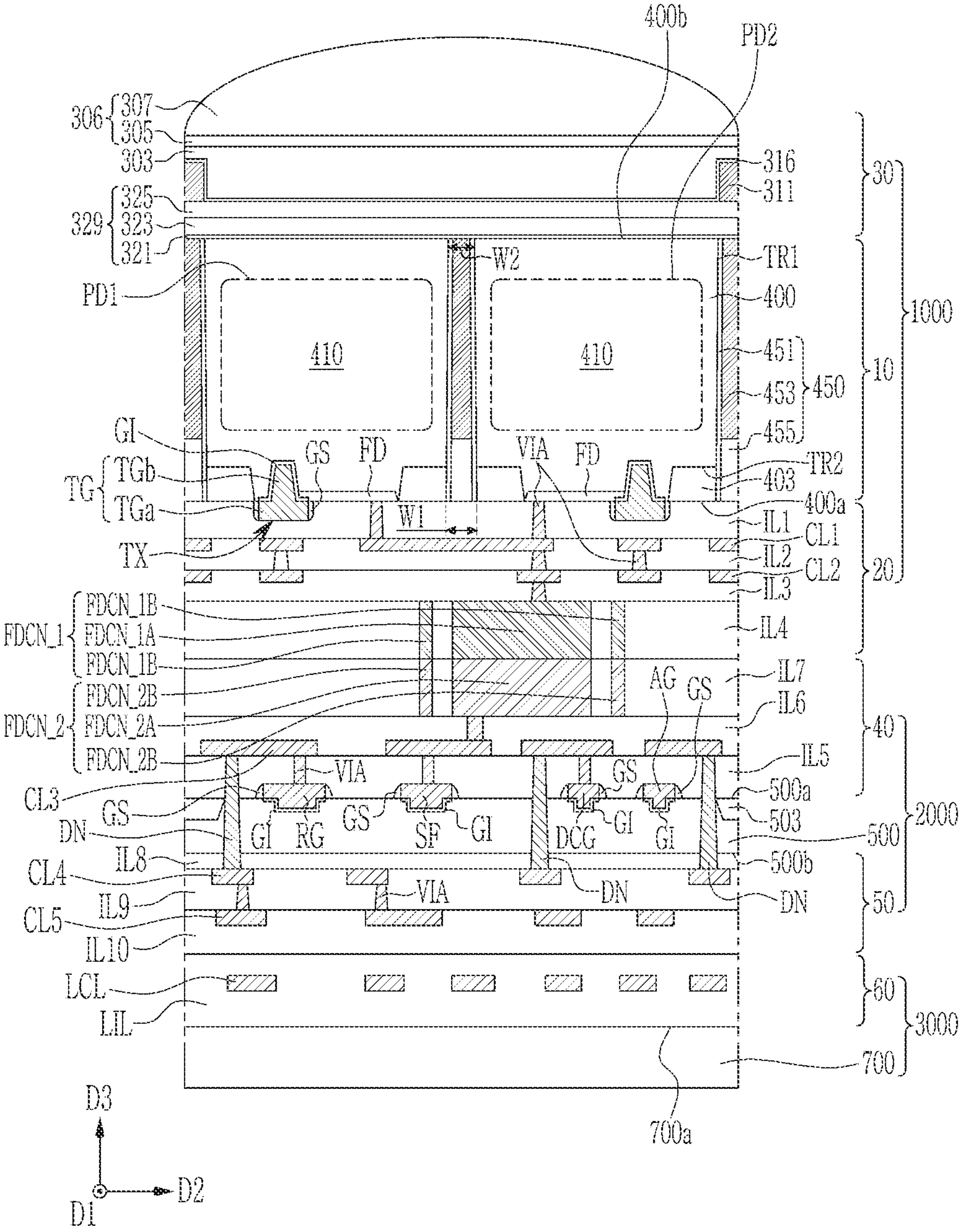
FIG. 4 is a partial cross-sectional view of one pixel PX of an example image sensor.

Simultaneously referring to FIG. 3 and FIG. 4, an image sensor may include a first chip 1000, a second chip 2000, and a third chip 3000. The first chip 1000 may include a photoelectric conversion layer 10, a first wiring area 20, and a light transmission layer 30. The photoelectric conversion layer 10 may include a first substrate 400, a pixel separation pattern 450, an element separation pattern 403, and a photoelectric conversion area 410 disposed in the first substrate 400. Externally incident light may be converted into an electrical signal in the photoelectric conversion area 410.

Referring to FIG. 3, the first substrate 400 may include a pixel array area AR, an optical black area OB, and a pad area PAD on a plane. The pixel array area AR may be disposed in a central region of the first substrate 400 on a plane. The pixel array area AR may include a plurality of pixels PX. The pixel PX may output a photoelectric signal from incident light. The pixels PX may be disposed along a row parallel to a first direction D1 and a column parallel to a second direction D2.

The pad area PAD may be disposed at an edge portion of the first substrate 400 and may surround the pixel array area AR. A plurality of pad terminals 90 may be disposed in the pad area PAD. The pad terminals 90 may output the electrical signal generated from the pixel PX to the outside. Alternatively, an external electrical signal or voltage may be transmitted to the pixel PX through the pad terminal 90. Since the pad area PAD is disposed on an edge of the first substrate 400, the pad terminal 90 can be easily connected to the outside.

The optical black area OB may be disposed between the pixel array area AR of the first substrate 400 and the pad area PAD. The optical black area OB may surround the pixel array area AR. A pixel disposed in the optical black area OB may include a dummy area instead of including the photoelectric conversion area 410. A signal generated from the dummy area may be used information for removing a process noise.

Hereinafter, referring to FIG. 4, a stacking structure of the image sensor will be described in detail. The image sensor may include the first chip 1000, the second chip 2000, and the third chip 3000.

The first chip 1000 is a layer generating a photoelectric signal by including the photoelectric conversion layer 10, the second chip 2000 may be a layer where transistors such as a reset transistor RX, a dual conversion transistor DCX, an amplification transistor SX, and a selection transistor AX and wires that connected with the respective transistors are disposed. A logic circuit may be disposed on the third chip 3000.

It is a feature of the present implementation that one or more wires connected with a reset transistor RX, a dual conversion transistor DCX, an amplification transistor SX, and a selection transistor AX of the second chip 2000 is disposed on the opposite side of the reset transistor RX, the dual conversion transistor DCX, the amplification transistor SX, and the selection transistor AX. That is, the reset transistor RX, the dual conversion transistor DCX, the amplification transistor SX, and the selection transistor AX and the wire are connected through a deep node DN that penetrates the second substrate 500 of the second chip 2000. Therefore, although it will be described later, a conversion gain CG may be increased by shortening a length to which the floating diffusion area FD is connected in the first chip 1000 and the second chip 2000, and the coupling between the floating diffusion area FD and wiring can be reduced.

Hereinafter, it will be described in detail with reference to FIG. 4.

The first chip 1000 includes the first substrate 400. The first substrate 400 may include first side 400*a* and second side 400*b* facing each other. Light may be incident on the second side 400*b* of the first substrate 400. A first wiring area 20 may be disposed on the first side 400*a* of the first substrate 400, and a light transmission layer 30 may be disposed on the second side 400*b* of the first substrate 400. The first substrate 400 may be a semiconductor substrate or a silicon-on insulator (SOI) substrate. For example, the semiconductor substrate may include a silicon substrate, a germanium substrate, or a silicon-germanium substrate. The first substrate 400 may include a first conductivity type impurity. For example, the impurity of the first conductivity type may be a p-type impurity such as aluminum (Al), boron (B), indium (In), and gallium (Ga).

The first substrate 400 may include a pixel separation pattern 450. The pixel separation pattern 450 may partition a plurality of unit pixels. In addition, when a plurality of photoelectric conversion areas are included in one pixel, the pixel separation pattern 450 may be disposed between the photoelectric conversion areas. FIG. 4 illustrates a partial cross-section of one pixel, and two photoelectric conversion areas are illustrated on a cross sectional view. However, this is a virtual cross-section for convenience of explanation, and the present disclosure is not limited thereto. That is, as shown in FIG. 2, one pixel may include eight photoelectric conversion areas, and the number of photoelectric conversion areas may vary.

The first substrate 400 may include a photoelectric conversion area 410. The photoelectric conversion area 410 is shown in FIG. It can perform the same function and role as the photoelectric conversion elements PD1, PD2, PD3, PD4, PD5, PD6, PD7, and PD8 shown in FIG.

The first photoelectric conversion element PD1 and second photoelectric conversion element PD2 are shown in FIG. 4.

The photoelectric conversion area 410 may be a region doped with a second conductivity type impurity within the first substrate 400. The impurity of the second conductivity type may have a conductivity type opposite to that of the first conductivity type. The impurity of the second conductivity type may be an n-type impurity such as phosphorus, arsenic, bismuth, and antimony. For example, each photoelectric conversion area 410 may include a first region adjacent to the first side 400*a* and a second region adjacent to the second side 400*b*. There may be a difference in impurity concentration between the first region and the second region of the photoelectric conversion area 410. Accordingly, the photoelectric conversion area 410 may have a potential slope between the first side 400*a* and the second side 400*b* of the first substrate 400. However, as another example, the photoelectric conversion area 410 may not have a potential slope between the first side 400*a* and the second side 400*b* of the first substrate 400.

The first substrate 400 and the photoelectric conversion area 410 may form a photodiode. That is, a p-n junction between the first substrate 400 of the first conductivity type and the photoelectric conversion area 410 Of the first substrate 400 may form a photodiode. The photoelectric conversion area 410 forming the photodiode may generate and accumulate photocharges in proportion to the intensity of incident light.

Referring to FIG. 4, the pixel separation pattern 450 may be disposed on the first substrate 400. On a plane, the pixel separation pattern 450 may have a lattice structure. Although it will be described later with reference to FIG. 5, the pixel separation pattern 450 may be disposed between a plurality of photoelectric conversion elements PD1, PD2, PD3, PD4, PD5, PD6, PD7, and PD8 included in one pixel while partitioning each pixel on a plane.

Referring to FIG. 4, the pixel separation pattern 450 may be disposed in a first trench TR1. The first trench TR1 may be recessed from the first side 400*a* of the first substrate 400. The pixel separation pattern 450 may extend from the first side 400*a* of the first substrate 400 toward the second side 400*b*. The pixel separation pattern 450 may be a deep trench isolation (DTI) layer. The pixel separation pattern 450 may penetrate the first substrate 400. A vertical height of the pixel separation pattern 450 may be substantially equal to a vertical thickness of the first substrate 400. For example, a width of the pixel separation pattern 450 may be gradually reduced from the first side 400*a* of the first substrate 400 toward the second side 400*b*. A width of the first side 400*a* of the pixel separation pattern 450 may be a first width W1, and a width of the second side 400*b* of the pixel separation pattern 450 may be a second width W2. That is, the first width W1 may be greater than the second width W2.

The pixel separation pattern 450 may include a first separation pattern 451, a second separation pattern 453, and a capping pattern 455. The first separation pattern 451 may be disposed along a sidewall of the first trench TR1. The first separation pattern 451 may include, for example, a silicon-based insulating material (e.g., silicon nitride, silicon oxide, or silicon oxynitride) or a high dielectric material (e.g., hafnium oxide or aluminum oxide). As another example, the first separation pattern 451 may include a plurality of layers, and each layer may include different materials. The first separation pattern 451 may have a lower refractive index than the first substrate 400. Accordingly, the crosstalk phenomenon between pixel PXs positioned on the first substrate 400 can may prevented or reduced.

The second separation pattern 453 may be disposed within the first separation pattern 451. For example, a sidewall of the second separation pattern 453 may be surrounded by the first separation pattern 451. The first separation pattern 451 may be disposed between the second separation pattern 453 and the first substrate 400. The second separation pattern 453 may be separated from the first substrate 400 by the first separation pattern 451. Therefore, the second separation pattern 453 may be electrically separated from the first substrate 400 during an image sensing operation. The second separation pattern 453 may include a crystalline semiconductor material, for example, polysilicon. For example, the second separation pattern 453 may further include a dopant, and the dopant may include a first conductivity type impurity or a second conductivity type impurity.

For example, the second separation pattern 453 may include doped polysilicon. Alternatively, the second separation pattern 453 may include an undoped crystalline semiconductor material. For example, the second separation pattern 453 may include undoped polysilicon. The term "undoped" may mean not going through an intentional doping process. The dopant may include an n-type dopant and a p-type dopant.

The capping pattern 455 may be disposed on a lower surface of the second separation pattern 453. The capping pattern 455 may be disposed adjacent to the first side 400*a* of the first substrate 400. A lower surface of the capping pattern 455 may be coplanar with the first side 400*a* of the first substrate 400. An upper surface of the capping pattern 455 may be substantially the same as a lower surface of the second separation pattern 453. The capping pattern 455 may include a non-conductive material. For example, the capping pattern 455 may include a silicon-based insulating material (e.g., silicon nitride, silicon oxide or silicon oxynitride) or a high dielectric material (e.g., hafnium oxide or aluminum oxide). Accordingly, the pixel separation pattern 450 may prevent photocharges generated by incident light incident on the pixel PX from being incident on other adjacent pixel PXs due to random drift. That is, the pixel separation pattern 450 may prevent a crosstalk phenomenon between the pixel PXs.

An element separation pattern 403 may be disposed within the first substrate 400. For example, the element separation pattern 403 may be disposed within the second trench TR2. The second trench TR2 may be recessed from the first side 400*a* of the first substrate 400. The element separation pattern 403 may be a shallow trench isolation (STI) layer. The element separation pattern 403 may define an active pattern (ACT) (refer to FIG. 5). An upper surface of the element separation pattern 403 may be disposed within the first substrate 400. A width of the element separation pattern 403 may gradually decrease from the first side 400*a* to the second side 400*b* of the first substrate 400. An upper surface of the element separation pattern 403 may be vertically spaced apart from the photoelectric conversion area 410. The pixel separation pattern 450 may overlap a part of the element separation pattern 403.

Figure 5:
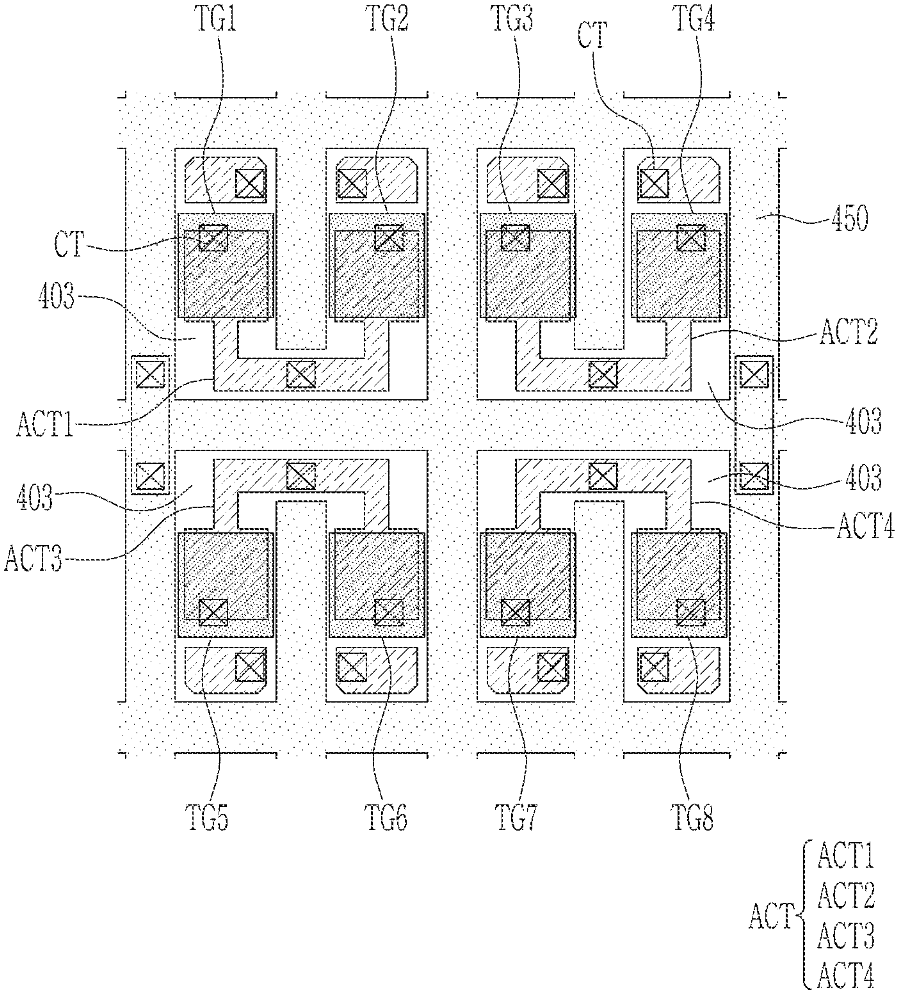
FIG. 5 to FIG. 7 illustrate an example arrangement of one pixel in the first substrate 400 on a plane.

The image sensor may include an active pattern ACT defined by the element separation pattern 403. Referring to FIG. 5, a plurality of active patterns ACT1, ACT2, ACT3, and ACT4 defined by the element separation pattern 403 are illustrated. FIG. 5 illustrates a configuration that a first active pattern ACT1, a second active pattern ACT2, a third active pattern ACT3, and a fourth active pattern ACT4 are included in one pixel PX, but this is just an example, and the present disclosure is not limited thereto. That is, the number of active patterns disposed on the plane and the dispose form may vary.

Referring back to FIG. 4, the transmission transistor TX previously described with reference to FIG. 2 may be disposed on the first side 400*a* of the first substrate 400. The transmission transistor TX may be electrically connected with the photoelectric conversion area 410. The transmission transistor TX may include a transmission gate TG and a floating diffusion area FD disposed on the active pattern ACT. The transmission gate TG may include a first portion TGa disposed on the first side 400*a* of the first substrate 400 and a second portion TGb extending into the first substrate 400 from the first portion TGa. A maximum width of the first portion TGa in the second direction D2 may be greater than a maximum width of the second portion TGb in the second direction D2. The floating diffusion area FD may be adjacent to one side of the transmission gate TG. The floating diffusion area FD may be disposed in the active pattern ACT. The floating diffusion area FD may have a second conductivity type (e.g., n-type) opposite to the first substrate 400.

A gate dielectric layer GI may be disposed between the transmission gate TG and the first substrate 400. A gate spacer GS may be disposed on a side wall of the transmission gate TG. The gate spacer GS may include a silicon nitride, a silicon carbonitride, or a silicon oxynitride.

The first wiring area 20 is disposed on the first side 400*a* of the first substrate 400, and may include a plurality of insulation layers IL1, IL2, IL3, and IL4, a plurality of wiring layers CL1 and CL2, a first floating diffusion area connection node FDCN_1, and a plurality of vias VIA.

The insulation layers may include a first insulation layer IL1, a second insulation layer IL2, a third insulation layer IL3, and a fourth insulation layer IL4.

The first insulation layer IL1 may cover the first side 400*a* of the first substrate 400. The first insulation layer IL1 may cover a gate electrode TG. The second insulation layer IL2 may be disposed on the first insulation layer IL1. The third insulation layer IL3 may be disposed on the second insulation layer IL2. The fourth insulation layer IL4 may be disposed on the third insulation layer IL3.

The first to fourth insulation layers IL1, IL2, IL3, and IL4 may include a non-conductive material. For example, the first to fourth insulation layers IL1, IL2, IL3, and IL4 may include a silicon-based insulating material such as a silicon oxide, a silicon nitride, or a silicon oxynitride.

The wiring layers CL1 and CL2 may include a first wiring layer CL1 and a second wiring layer CL2. The first wiring layer CL1 may be disposed in the second insulation layer IL2. The second wiring layer CL2 may be disposed in the third insulation layer IL3.

Wiring positioned on each of the first wiring layer CL1 and the second wiring layer CL2 may be connected to the floating diffusion area FD through a via VIA. The via VIA may penetrate the insulation layers IL1, IL2, IL3, and IL4.

Figure 6:
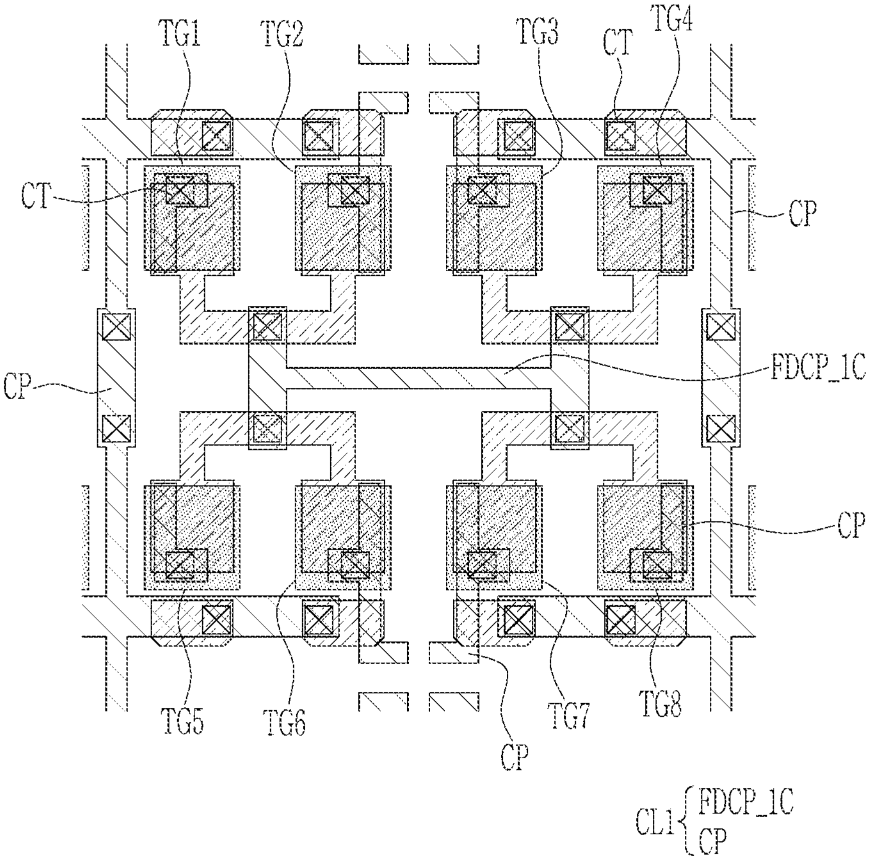
Figure 7:
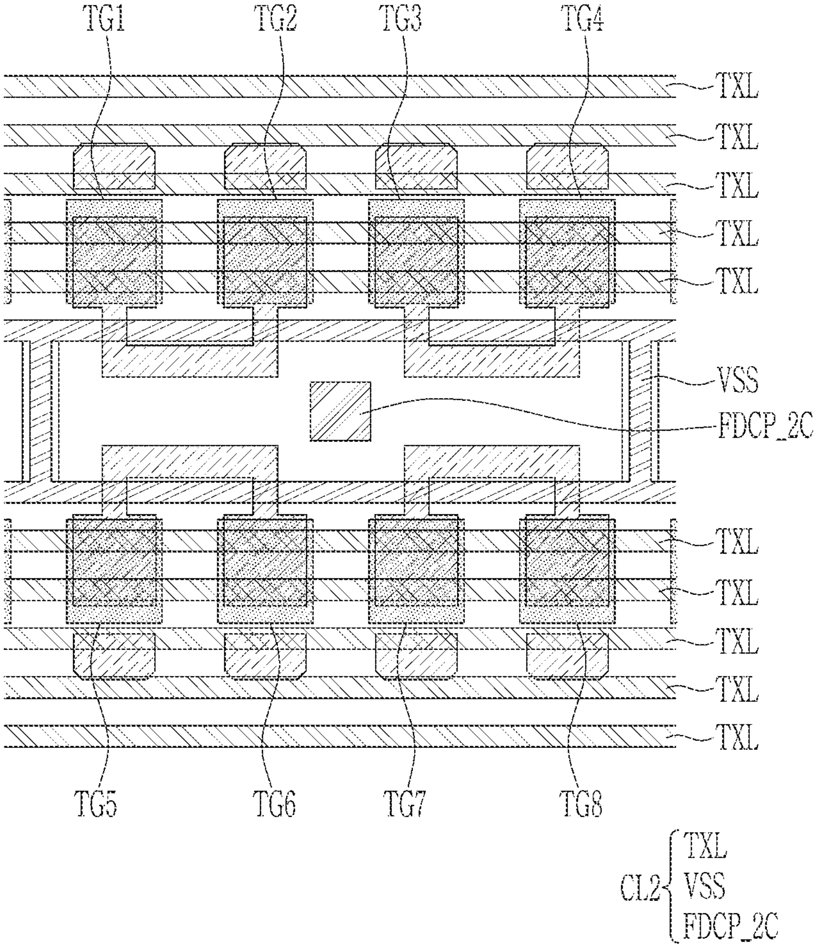

The wiring arrangement of the wiring layers CL1 and CL2 may be disposed regardless of the arrangement of the photoelectric conversion area 410 and is not limited to the shown arrangement and can be variously changed. FIG. 6 shows a planar arrangement of the first wiring layer CL1, and FIG. 7 shows a planar arrangement of the second wiring layer CL2. However, this is only an example, and the dispose of each of the wiring layers CL1 and CL2 is not limited thereto.

The first floating diffusion area connection node FDCN_1 may be disposed in the fourth insulation layer IL4. The first floating diffusion area connection node FDCN_1 may include a main connection portion FDCN_1A and a shielding portion FDCN_1B. The shielding portion FDCN_1B may be disposed on an edge of the main connection portion FDCN_1A, and may be disposed while occupying a narrower area than the main connection portion FDCN_1A. The shielding portion FDCN_1B may prevent interference between floating diffusion area connection nodes of neighboring pixels PX. The main connection portion FDCN_1A of the first floating diffusion area connection node FDCN_1 is connected with wires of the first wiring layer CL1 and the second wiring layer CL2, but the shielding portion FDCN_1B of the first floating diffusion area connection node FDCN_1 may not be connected with wires of the first wiring layer CL1 and wires of the second wiring layer CL2. In addition, the main connection portion FDCN_1A of the first floating diffusion area connection node FDCN_1 is disposed in an island shape separated for each pixel, but the shielding portion FDCN_1B may be connected to neighboring pixels. For example, the shielding portion FDCN_1B may be disposed linearly extending in one direction on a plane. A separate voltage may be applied to the shielding portion FDCN_1B.

As shown in FIG. 4, one side of the first floating diffusion area connection node FDCN_1 is exposed rather than being covered by the fourth insulation layer IL4. Therefore, as will be described later, it may contact a second floating diffusion area connection node FDCN_2 disposed at the second chip 2000.

A plurality of vias VIA may be disposed inside the first insulation layer IL1, the second insulation layer IL2, and the third insulation layer IL3. The vias VIA may connect the floating diffusion area FD, the first wiring layer CL1, the second wiring layer CL2, and the first floating diffusion area connection node FDCN_1.

The first wiring layer CL1, the second wiring layer CL2, the first floating diffusion area connection node FDCN_1, and the vias VIA may include a metal material. For example, the first wiring layer CL1, the second wiring layer CL2, the first floating diffusion area connection node FDCN_1, and the vias VIA may contain copper (Cu).

FIG. 5 to FIG. 7 illustrate an example arrangement of one pixel PX in the first substrate 400 on a plane. In FIG. 5 to FIG. 7, for better comprehension and ease of description, a part of constituent elements disposed on the first substrate 400 is selectively illustrated. The planar shape shown in FIG. 5 to FIG. 7 is only an example, and the present disclosure is not limited thereto.

FIG. 5 illustrates the pixel separation pattern 450, the element separation pattern 403, the plurality of active patterns ACT1, ACT2, ACT3, and ACT4, and the transmission gates TG1, TG2, TG3, TG4, TG5, TG6, TG7, and TG8. Active patterns ACT1, ACT2, ACT3, and ACT4 adjacent to the respective transmission gates TG1, TG2, TG3, TG4, TG5, TG6, TG7, and TG8 may include a floating diffusion area. The active pattern ACT may include a first active pattern ACT1, a second active pattern ACT2, a third active pattern ACT3, and a fourth active pattern ACT4.

In FIG. 5, a contact CT for connection with the first wiring layer CL1 is also illustrated. Simultaneously referring to FIG. 2 and FIG. 5, one pixel PX may include eight transmission gates TG1, TG2, TG3, TG4, TG5, TG6, TG7, and TG8 and a plurality of transmission transistors TX1, TX2, TX3, TX4, TX5, TX6, TX7, and TX8 formed by each transmission gate. However, this is only an example and the present disclosure is not limited thereto.

FIG. 6 illustrates the plurality of active patterns ACT1, ACT2, ACT3, and ACT4, the respective transmission gates TG1, TG2, TG3, TG4, TG5, TG6, TG7, and TG8, and the first wiring layer CL1. The first wiring layer CL1 may include a plurality of connection patterns CP connected with the contact CT and a first floating diffusion area connection pattern FDCP_1C. Referring to FIG. 6, floating diffusion areas that are adjacent to the respective transmission gates TG1, TG2, TG3, TG4, TG5, TG6, TG7, and TG8 may be connected with the first floating diffusion area connection pattern FDCP_1C. That is, floating diffusion areas FD that are adjacent to the respective transmission gates TG1, TG2, TG3, TG4, TG5, TG6, TG7, and TG8 may be connected to one in the first floating diffusion area connection pattern FDCP_1C.

FIG. 7 illustrates the plurality of active patterns ACT1, ACT2, ACT3, and ACT4, the transmission gates TG1, TG2, TG3, TG4, TG5, TG6, TG7, and TG8, and the second wiring layer CL2. The second wiring layer CL2 may include a second diffusion area connection pattern FDCP_2C, a plurality of transmission signal wires TXL, and a ground wire VSS. The respective transmission signal wires TXL may be connected with the transmission gates TG1, TG2, TG3, TG4, TG5, TG6, TG7, and TG8 and transmit a transmission signal. Simultaneously referring to FIG. 2, the ground wire VSS may be connected with the photoelectric conversion elements PD1, PD2, PD3, PD4, PD5, PD6, PD7, and PD8 and transmit a ground voltage.

The second diffusion area connection pattern FDCP_2C of FIG. 7 may be connected with the first floating diffusion area connection pattern FDCP_1C of FIG. 6. As previously described with reference to FIG. 4, the first floating diffusion area connection pattern FDCP_1C disposed in the first wiring layer CL1 and the second diffusion area connection pattern FDCP_2C disposed in the second wiring layer CL2 may be connected through the vias VIA.

Thus, floating diffusion areas that are adjacent to the respective transmission gates TG1, TG2, TG3, TG4, TG5, TG6, TG7, and TG8 may be connected with the second diffusion area connection pattern FDCP_2C through the first floating diffusion area connection pattern FDCP_1C. Although it is not illustrated in FIG. 7, referring to FIG. 4, the second diffusion area connection pattern FDCP_2C, which is the second wiring layer CL2, may be connected with the first floating diffusion area connection node FDCN_1 through the vias VIA.

Referring back to FIG. 4, the first chip 1000 may include a light transmission layer 30. The light transmission layer 30 may include an insulation structure 329, a color filter 303, and a micro lens portion 306. The light transmission layer 30 may condense and filter light incident from the outside and provide the light to the photoelectric conversion area 410.

The color filter 303 may be disposed on the second side 400*b* of the first substrate 400. The color filter 303 may be disposed in each pixel PX. In each pixel PX, the color filter 303 may include a primary color filter. The color filter 303 may include a first color filter, a second color filter, and a third color filter, each having a different color. For example, the first color filter, the second color filter, and the third color filter may include a green color filter, a red color filter, and a blue color filter, respectively. The first color filter, the second color filter, and the third color filter may be arranged in a bayer pattern method. As another example, the first color filter, the second color filter, and the third color filter may include colors such as cyan, magenta, or yellow.

The insulation structure 329 may be disposed between the second side 400*b* of the first substrate 400 and the color filter 303. The insulation structure 329 may prevent light from being reflected such that light incident on the second side 400*b* of the first substrate 400 can smoothly reach the photoelectric conversion area 410. The insulation structure 329 may be referred to as an anti-reflection structure.

The insulation structure 329 may include a first fixed charge film 321, a second fixed charge film 323, and a planarization film 325 sequentially accumulated on the second side 400*b* of the first substrate 400. The first fixed charge film 321, the second fixed charge film 323, and the planarization film 325 may respectively include different materials. The first fixed charge film 321 may include any one of an aluminum oxide, a tantalum oxide, a titanium oxide, and a hafnium oxide. The second fixed charge film 323 may include another one of an aluminum oxide, a tantalum oxide, a titanium oxide, and a hafnium oxide. For example, the first fixed charge film 321 may include an aluminum oxide, the second fixed charge film 323 may include a hafnium oxide, and the planarization film 325 may include a silicon oxide. Although not shown, in some implementations, a silicon anti-reflection layer may be interposed between the second fixed charge film 323 and the planarization film 325. The anti-reflection layer may include a silicon nitride.

The micro lens portion 306 may be disposed on the color filter 303. The micro lens portion 306 may include a planarization portion 305 that contacts the color filter 303 and a micro lens 307 disposed on the planarization portion 305. The planarization portion 305 may include, for example, an organic material. As another example, the planarization portion 305 may include a silicon oxide or a silicon oxynitride. The micro lens 307 may have a convex shape to condense light incident to the pixel PX. Each micro lens 307 may overlap the photoelectric conversion area 410 vertically. The shape of the lens can vary. FIG. 4 illustrates one micro lens 307 a shape overlapping two photoelectric conversion area 410, for better comprehension and ease of description, but one micro lens 307 may be disposed with a shape overlapping eight photoelectric conversion area 410. That is, one micro lens 307 may be located on one pixel PX shown in FIG. 5 to FIG. 7 on a plane. However, this is just an example, and the number of micro lenses 307 positioned on one pixel PX may vary.

The light transmission layer 30 may further include a low refractive pattern 311 and a protective layer 316. The low refractive pattern 311 may be disposed between adjacent color filters 303 to separate them from each other. The low refractive pattern 311 may be disposed on the insulation structure 329. For example, the low refractive pattern 311 may have a lattice structure. The low refractive pattern 311 may include a material having a lower refractive index than the color filter 303. The low refractive pattern 311 may include an organic material. For example, the low refractive pattern 311 may be a polymer layer containing silica nano particles. Since the low refractive pattern 311 has a low refractive index, the amount of light incident to the photoelectric conversion area 410 can be increased and crosstalk between pixel PXs can be reduced. That is, light reception efficiency can be increased in each photoelectric conversion area 410, and signal noise ratio (SNR) characteristics can be improved.

The protective layer 316 may cover a surface of the low refractive pattern 311 with a substantially uniform thickness. The protective layer 316 may include, for example, a single layer or multilayer of at least one of an aluminum oxide layer and a silicon carbonized layer. The protective layer 316 protects the color filter 303 and may absorb moisture.

Then, the second chip 2000 will be described hereinafter. The second chip 2000 may include a second substrate 500, a second wiring area 40, and a third wiring area 50.

The second substrate 500 may include a first side 500*a* and a second side 500*b* facing each other. The second wiring area 40 may be disposed on the first side 500*a* of the second substrate 500 and the third wiring area 50 may be disposed on the second side 500*b* of the second substrate 500.

The second substrate 500 may be a semiconductor substrate or a silicon-on insulator (SOI) substrate. The semiconductor substrate may include, for example, a silicon substrate, a germanium substrate, or a silicon-germanium substrate. The second substrate 500 may include an impurity of the first conductivity type. For example, the impurity of the first conductivity type may include p-type impurity such as aluminum (Al), boron (B), indium (In), and/or gallium (Ga).

The first side 500*a* of the second substrate 500 may be disposed facing the first side 400*a* of the first substrate 400.

Figure 8:
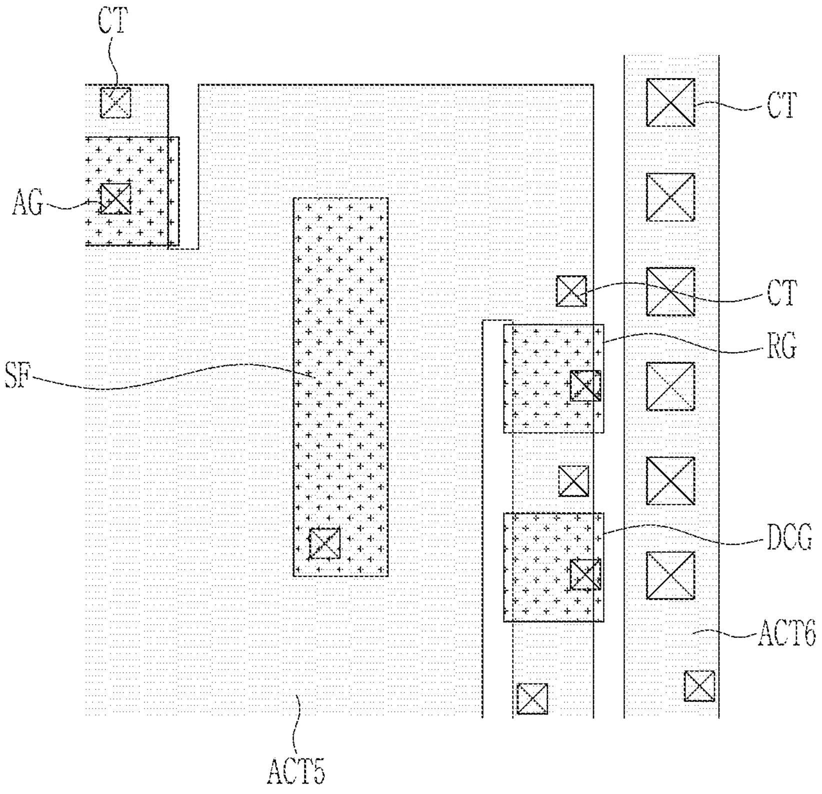
FIG. 8 to FIG. 11 illustrate an example arrangement of a first side and a second side of the second substrate on one pixel on a plane.

Simultaneously referring to FIG. 4 and FIG. 8, the second substrate 500 may include a fifth active pattern ACT and a sixth active pattern ACT6 defined by an element separation pattern 503. The gate electrode RG of the reset transistor RX, the gate electrode DCG of the dual conversion transistor DCX, the gate electrode SF of the amplification transistor SX, and the gate electrode AG of the selection transistor AX described with reference to FIG. 2 may be disposed on the first side 500*a* of the second substrate 500. The cross-section of FIG. 4 is a virtual cross-section for convenience of description, and the present disclosure is not limited thereto. That is, the cross-section of FIG. 4 may not coincide with the planar dispose of FIG. 5 to FIG. 7 and the planar dispose of FIG. 8 to FIG. 11. The cross-section in FIG. 4 is a cross-section for convenience to explain the stacking structure of the image sensor and the configuration of the deep node, and the planar dispose of FIG. 5 to FIG. 11 is also an example and the planar dispose may vary.

A gate dielectric layer GI may be disposed respectively between the gate electrode AG of the selection transistor TX, the gate electrode SF of the amplification transistor SX, the gate electrode DCG of the dual conversion transistor DCX, and the gate electrode RF of the reset transistor RX. A gate spacer GS may be disposed on a side wall of each of the gate electrodes AG, SF, DCG, and RG. The gate spacer GS may include a silicon nitride, a silicon carbonitride or a silicon oxynitride.

Although it is not illustrated in FIG. 4, a second floating diffusion area may be disposed in the fifth active pattern ACT5 that is adjacent to the gate electrode RG of the reset transistor RX, the gate electrode DCG of the dual conversion transistor DCX, the gate electrode SF of the amplification transistor SX, and the gate electrode AG of the selection transistor AX.

A fifth insulation layer IL5, a sixth insulation layer IL6, a seventh insulation layer IL7, a third wiring layer CL3, the plurality of vias VIA, and the second floating diffusion area connection node FDCN_2 may be disposed on the first side 500*a* of the second substrate 500.

The fifth insulation layer IL5, the sixth insulation layer IL6, and the seventh insulation layer IL7 may include a non-conductive material. For example, the fifth insulation layer IL5, the sixth insulation layer IL6, and the seventh insulation layer IL7 may include a silicon-based insulating material such as a silicon oxide, a silicon nitride, or a silicon oxynitride.

The third wiring layer CL3, the via VIA, and the second floating diffusion area connection node FDCN_2 may include a metal material. For example, the third wiring layer CL3, the via VIA, and the second floating diffusion area connection node FDCN_2 may contain copper (Cu).

The third wiring layer CL3 may be disposed inside the sixth insulation layer IL6. One or more of the gate electrode RG of the reset transistor RX, the gate electrode DCG of the dual conversion transistor DCX, the gate electrode SF of the amplification transistor SX, and the gate electrode AG of the selection transistor AX may be connected with a wire of the third wiring layer CL3 may be connected through the via VIA. In addition, an electrode of one or more of the gate electrode RG of the reset transistor RX, the gate electrode DCG of the dual conversion transistor DCX, the gate electrode SF of the amplification transistor SX, and the gate electrode AG of the selection transistor AX may be connected with the third wiring layer CL3 through the via VIA.

The second floating diffusion area connection node FDCN_2 may be disposed in the seventh insulation layer IL7. The second floating diffusion area connection node FDCN_2 may include a main connection portion FDCN_2A and a shielding portion FDCN_2B. The shielding portion FDCN_2B may be disposed at an edge of the main connection portion FDCN_2A and may occupy a narrower area than the main connection portion FDCN_2A. The shielding portion FDCN_2B may prevent interference between floating diffusion area connection nodes of neighboring pixels. The main connection portion FDCN_2A of the second floating diffusion area connection node FDCN_2 may be connected with the wiring of the third wiring layer CL3, but the shielding portion FDCN_2B of the second floating diffusion area connection node FDCN_2 may not be connected with the wire of the third wiring layer CL3. The main connection portion FDCN_2A of the second floating diffusion area connection node FDCN_2 is disposed in an island shape separated for each pixel, but the shielding portion FDCN_2B may be connected to neighboring pixels. For example, the shielding portion FDCN_2B may be disposed linearly extending in one direction on a plane. A separate voltage may be applied to the shielding portion FDCN_2B.

As shown in FIG. 4, one side of the second floating diffusion area connection node FDCN_2 is exposed rather than being covered by the seventh insulation layer IL7. Accordingly, as shown in FIG. 4, the first floating diffusion area connection node FDCN_1 disposed in the first chip 1000 and the second floating diffusion area connection node FDCN_2 disposed in the second chip 2000 may be in contact with each other.

Referring to FIG. 4, the second chip 2000 includes a deep node DN that penetrates the second substrate 500. The deep node DN may include a metal, for example, copper (Cu). However, the material is only an example, and other metal material may also be included.

Since the deep node DN is disposed while penetrating the second substrate 500, one end of the deep node DN may be disposed on the first side 500*a* and the other end may be disposed on the second side 500*b*. In the present specification, the expression of positioning on a certain surface is not limited to positioning in contact with the surface, but includes positioning in a non-contact or protruded form on the surface. That is, as shown in FIG. 4, one end of the deep node DN is disposed while protruding on the first side 500*a*, and the other end may be disposed while protruding on the second side 500*b*.

Accordingly, as shown in FIG. 4, one end of the deep node DN may be in contact with the wire of the third wiring layer CL3. In addition, the other end of the deep node DN may be in contact with a fourth wiring layer CL4 disposed on the second side 500*b*.

An eighth insulation layer IL8, a ninth insulation layer IL9, a tenth insulation layer IL10, a fourth wiring layer CL4, a fifth wiring layer CL5, and a via VIA may be disposed on the second side 500*b* of the second substrate 500.

The eighth insulation layer IL8, the ninth insulation layer IL9, and the tenth insulation layer IL10 may include a non-conductive material. For example, the eighth insulation layer IL8, the ninth insulation layer IL9, and the tenth insulation layer IL10 may include a silicon-based insulating material such as a silicon oxide, a silicon nitride, or a silicon oxynitride.

The fourth wiring layer CL4, the fifth wiring layer CL5, and the via VIA may include a metal material. For example, the fourth wiring layer CL4, the fifth wiring layer CL5, and the via VIA may contain copper (Cu). However, the material is only an example and the present disclosure is not limited thereto.

The fourth wiring layer CL4 may be disposed in the ninth insulation layer IL9. The fifth wiring layer CL5 may be disposed in the tenth insulation layer IL10. The fourth wiring layer CL4 and the fifth wiring layer CL5 may be connected with the via VIA.

The deep node DN may be disposed in the fifth insulation layer IL5, the second substrate 500, and the eighth insulation layer IL8. The deep node DN may be disposed to penetrate the second substrate 500, and may connect one or more of the reset transistor RX, the dual conversion transistor DCX, the amplification transistor SX, and the selection transistor AX disposed on the first side 500*a* of the second substrate 500 and the fourth wiring layer CL4 and the fifth wiring layer CL5 disposed on the second side 500*b* of the second substrate 500.

That is, wires located in the fourth wiring layer CL4 and the fifth wiring layer CL5 may be connected with the gate electrode RG of the reset transistor RX, the gate electrode DCG of the dual conversion transistor DCX, and the gate electrode AG of the selection transistor AX and may transmit a gate signal. In addition, the wires may be connected with source electrodes of the reset transistor RX and amplification transistor SX and may apply the power source voltage VDD. In addition, an output wire Vout disposed in the fourth wiring layer CL4 or fifth wiring layer CL5 may be connected with a drain electrode of the selection transistor AX. Referring to FIG. 2, one or more bolded wires shown in FIG. 2 may be disposed on the second side 500*b* of the second substrate 500.

As described in the image sensor, the reset transistor RX, the dual conversion transistor DCX, the amplification transistor SX, and the selection transistor AX may be disposed on the first side 500*a* of the second substrate 500, and one or more wires connected with the reset transistor RX, the dual conversion transistor DCX, the amplification transistor SX, and the selection transistor AX may be disposed on the second side 500*b* of the second substrate 500. The reset transistor RX, the dual conversion transistor DCX, the amplification transistor SX, and the selection transistor AX and the wire may be connected through the deep node DN penetrating the second substrate 500.

As such, since each transistor and the wire are disposed on different planes, the length to which the floating diffusion area is connected between the first chip 1000 and the second chip 2000 can be shortened. That is, in FIG. 4, when the fourth wiring layer CL4 and the fifth wiring layer CL5 are disposed on the first side 500*a* of the second substrate 500, a distance between the first side 400*a* of the first substrate 400 and the first side 500*a* of the second substrate 500 is increased by a thickness of the fourth wiring layer CL4, the fifth wiring layer CL5, and an insulation layer for insulating them. However, in the image sensor, the fourth wiring layer CL4 and the fifth wiring layer CL5 are disposed on the second side 500*b* of the second substrate 500, and thus the distance between the first side 400*a* of first substrate 400 and the first side 500*a* of the second substrate 500. Therefore, in the first chip 1000 and the second chip 2000, the length to which the floating diffusion area FD is connected is shortened, and the conversion gain CG can be improved.

In addition, since the floating diffusion area FD and the floating diffusion area connection nodes FDCN_1 and FDCN_2 and the wires connected thereto are disposed on different sides with the second substrate 500 in between, the coupling between the floating diffusion area FD and the wiring can be minimized. Simultaneously referring to FIG. 2 and FIG. 4, for example, the wire of the fourth wiring layer CL4 connected with the gate electrode RG of the reset transistor RX and the wire of the fourth wiring layer CL4 connected with the gate electrode DCG of the dual conversion transistor DCX are disposed while disposing the second floating diffusion area connection node FDCN_2 and the second substrate 500 therebetween. Accordingly, coupling between the floating diffusion area connection node FDCN_2 and the wire connected to each transistor can be minimized.

Similarly, simultaneously referring to FIG. 2 and FIG. 4, the output wire Vout disposed in the fourth wiring layer CL4 may be disposed with the second floating diffusion area connection node FDCN_2 and the second substrate 500 in between. Therefore, coupling between the floating diffusion area connection node FDCN_2 and output wire Vout can be minimized.

Referring to FIG. 4, the second chip 2000 may be connected with the third chip 3000. The third chip 3000 may include a third substrate 700 and a fourth wiring area 60. A transistor that forms a logic circuit may be disposed on a first side 700*a* of the third substrate 700 and a plurality of wires LCL may be disposed in the fourth wiring area 60. The fourth wiring area 60 may include an insulation layer LIL, and the plurality of wires LCL may be connected with the wire of the second chip 2000 through a via.

The third substrate 700 may be a semiconductor substrate or a silicon-on insulator (SOI) substrate. The semiconductor substrate may include, for example, a silicon substrate, a germanium substrate, or a silicon-germanium substrate. The third substrate 700 may include an impurity of the first conductivity type. For example, the impurity of the first conductivity type may include p-type impurity such as aluminum (Al), boron (B), indium (In), and/or gallium (Ga).

FIG. 8 to FIG. 11 illustrate an example arrangement of the first side 500*a* and the second side 500*b* of the second substrate 500 on one pixel PX on a plane. In FIG. 8 to FIG. 11, for better comprehension and ease of description, a part of constituent elements disposed on the second substrate 500 is selectively illustrated. The planar shape shown in FIG. 8 to FIG. 11 is only an example, and the present disclosure is not limited thereto.

Figure 9:
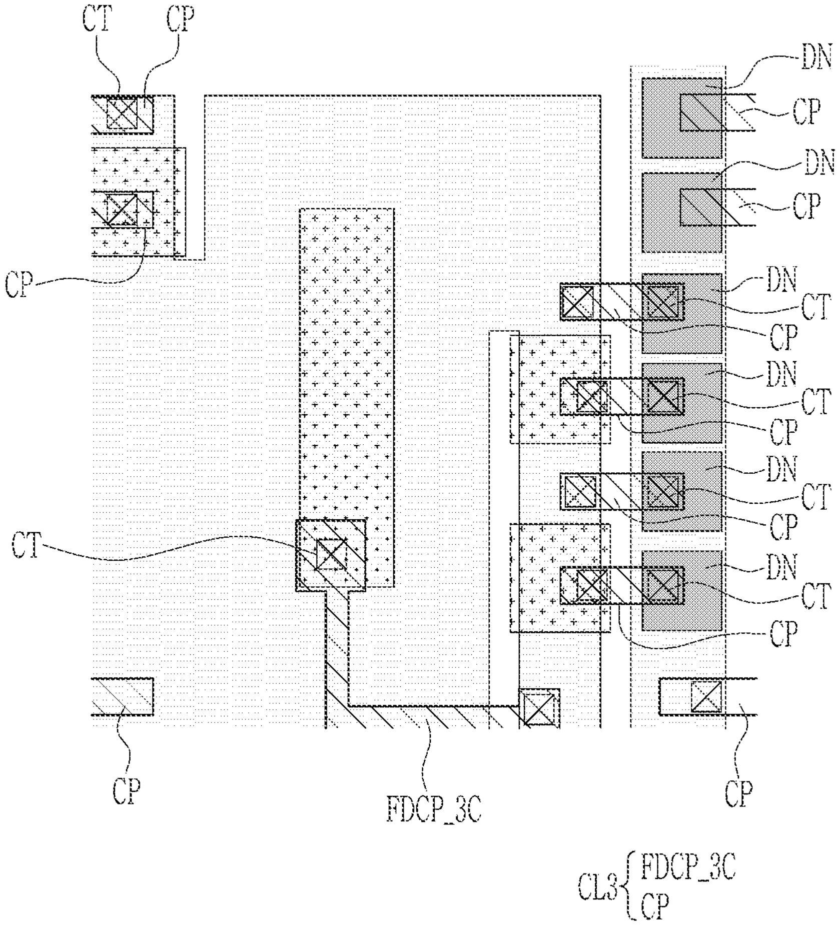

FIG. 8 illustrates the first side 500*a* of the second substrate 500, and illustrates the fifth active pattern ACT5, the sixth active pattern ACT6, and the gate electrodes. Referring to FIG. 8, the fifth active pattern ACT5 may be disposed, and the gate electrode RG of the reset transistor RX, the gate electrode DCG of the dual conversion transistor DCX, the gate electrode SF of the amplification transistor SX, and the gate electrode AG of the selection transistor AX may be disposed on the fifth active pattern ACT5. In FIG. 9, a contact CT for connection with the third wiring layer CL3 is also illustrated.

FIG. 9 illustrates the first side 500*a* of the second substrate 500, and the third wiring layer CL3 and the deep node DN are additionally illustrated in FIG. 9. The third wiring layer CL3 may include a plurality of connection patterns CP. Each connection pattern CP may be connected with each gate electrode or the fifth active pattern ACT5 and the sixth active pattern ACT6 in the contact CT. The connection pattern CP may include a third floating diffusion area connection patter FDCP_3C. The third floating diffusion area connection patter FDCP_3C may be connected to the second floating diffusion area connection node FDCN_2 shown in FIG. 4.

In FIG. 9, it is illustrated that the deep node DN is disposed in parallel with one side, but this is just an example, and the arrangement of the second substrate 500 on a plane is not limited thereto.

Figure 10:
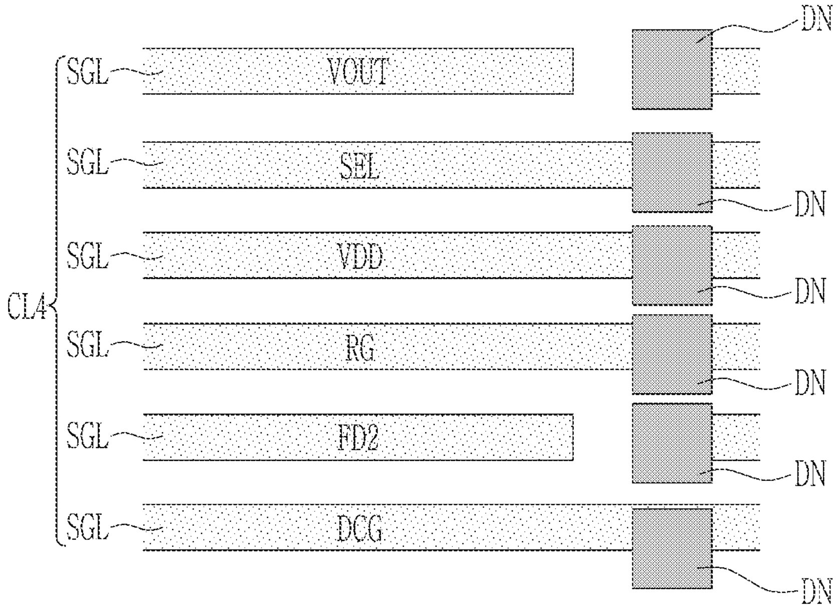

FIG. 10 illustrates the second side 500*b* of the second substrate 500, and the fourth wiring layer CL4 and the deep node DN are illustrated. The fourth wiring layer CL4 may be connected with the third wiring layer CL3 disposed on the first side 500*a* of the second substrate 500 through the deep node DN. The fourth wiring layer CL4 may include a plurality of signal wires SGL. In FIG. 10, signals transmitted from the respective signal wires SGL are described on the signal wires SGL, but this is only an example and the present disclosure is not limited thereto. A signal wiring SGL in which FD2 indicated in FIG. 10 may be a wire connected to a second floating diffusion area in the case that the second substrate 500 includes second floating diffusion area.

Figure 11:
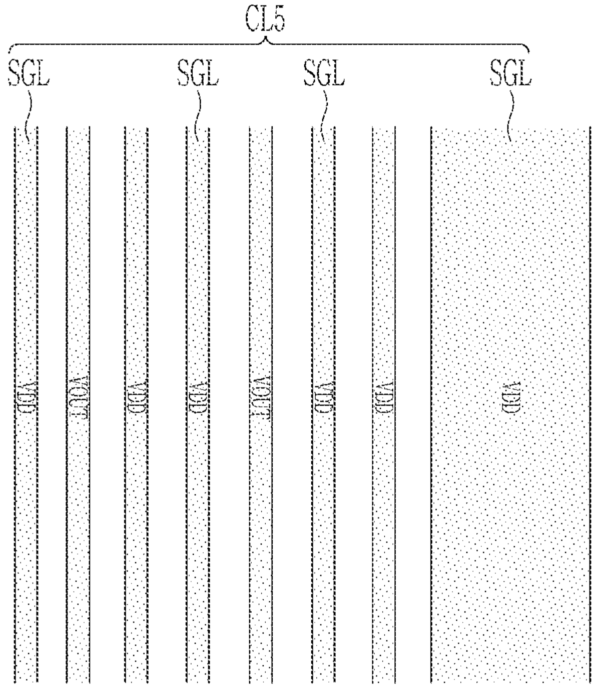

FIG. 11 illustrates the second side 500*b* of the second substrate 500, and the fifth wiring layer CL5 is illustrated. Wires disposed on the fifth wiring layer CL5 may be connected with the wires disposed on the fourth wiring layer CL4 though a via VA like the via VIA shown in FIG. 4. The fifth wiring layer CL5 may include a plurality of signal wires SGL. The signal wires SGL of the fifth wiring layer CL5 may be disposed in a direction crossing the signal wire SGL of the fourth wiring layer CL4. However, this is only an example, and the present disclosure is not limited thereto. In FIG. 11, signals transmitted from the respective signal wires SGL are indicated on the signal wire SGL, but this is only an example and the present disclosure is not limited thereto.

The planar arrangement of the first side 500*a* and the second side 500*b* of the second substrate 500 shown in FIG. 8 to FIG. 11 is only an example, and the present disclosure is not limited thereto.

Hereinafter, referring to FIG. 12 to FIG. 18, a manufacturing method of the image sensor will be described. Hereinafter, a forming process of the deep node DN and a forming process of the fourth wiring layer CL4 and the fifth wiring layer CL5 on the second side 500*b* of the second substrate 500 will be mainly described, and other constituent elements may be formed by a conventional manufacturing method of an image sensor.

FIG. 12 to FIG. 18 show an example manufacturing process of the image sensor.

Figure 12:
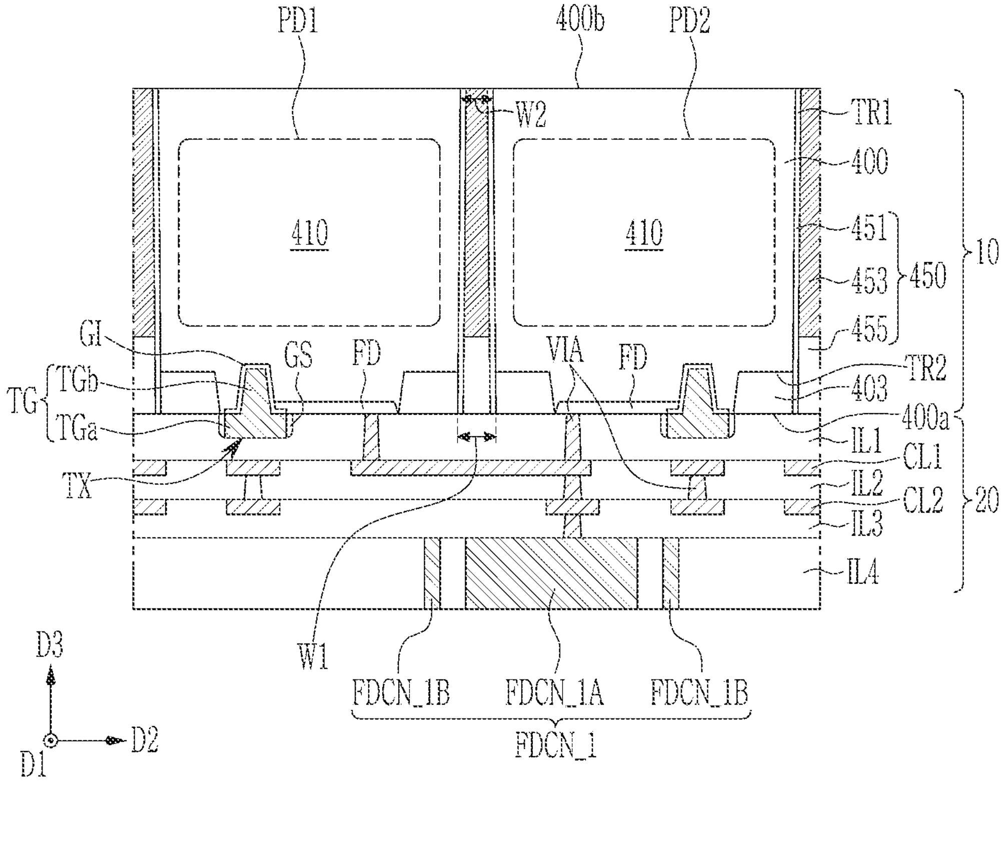
FIG. 12 to FIG. 18 show an example manufacturing process of the image sensor.

First, referring to FIG. 12, the first substrate 400 is prepared. A description of the first substrate 400 is the same as the description of FIG. 4, and thus detailed descriptions of the same constituent elements are omitted. That is, the first substrate 400 may include a photoelectric conversion layer 10 and a first wiring area 20. The photoelectric conversion layer 10 may include a photoelectric conversion area 410 and a plurality of transmission transistors TX. The description of the photoelectric conversion layer 10 and the first wiring area 20 is omitted from the detailed description of the same constituent elements as described above.

Figure 13:
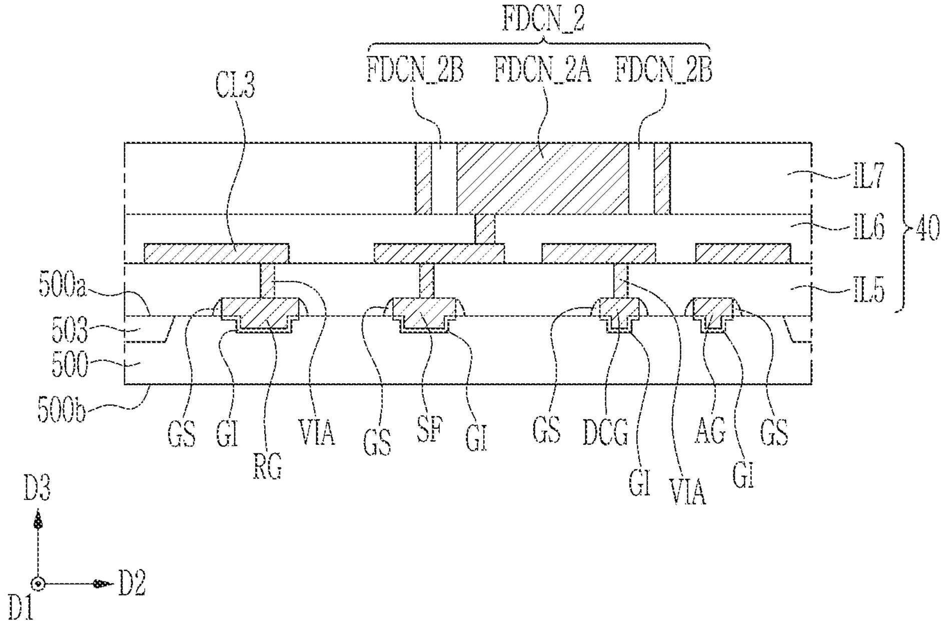

Next, referring to FIG. 13, the second substrate 500 is prepared. The second substrate 500 may be in a state in which the second wiring area 40 is formed on the first side 500*a*. The description of the first side 500*a* and the second wiring area 40 of the second substrate 500 is the same as the description of FIG. 4, and therefore detailed descriptions of the same constituent elements are omitted. That is, simultaneously referring to FIG. 4, FIG. 8, and FIG. 13, the first side 500*a* of the second substrate 500 may include the gate electrode RG of the reset transistor RX, the gate electrode DCG of the dual conversion transistor DCX, the gate electrode SF of the amplification transistor SX, and the gate electrode AG of the selection transistor AX disposed on the fifth active pattern ACT5.

The fifth insulation layer IL5, the sixth insulation layer IL6, the seventh insulation layer IL7, the third wiring layer CL3, the plurality of vias VIA, and the second floating diffusion area connection node FDCN_2 may be disposed on the first side 500*a* of the second substrate 500.

The wire of the third wiring layer CL3 and one or more of the gate electrode RG of the reset transistor RX, the gate electrode DCG of the dual conversion transistor DCX, the gate electrode SF of the amplification transistor SX, and the gate electrode AG of the selection transistor AX are connected through the via VIA. In addition, the second floating diffusion area connection node FDCN_2 may be disposed inside the seventh insulation layer IL7.

Figure 14:
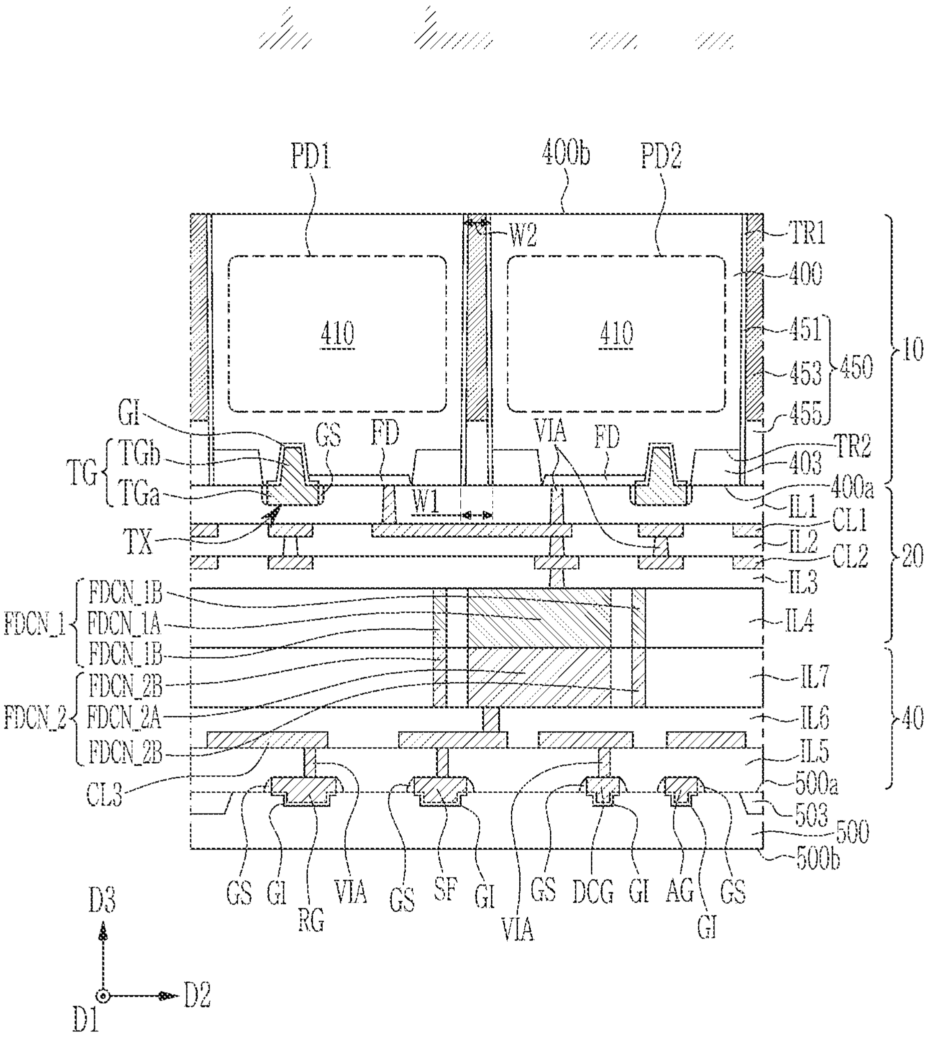

Next, referring to FIG. 14, the first substrate 400 of FIG. 12 and the second substrate 500 of FIG. 13 are bonded. In this case, the first side 400*a* of the first substrate 400 and the first side 500*a* of the second substrate 500 may face each other. During the bonding process, the first floating diffusion area connection node FDCN_1 of the first substrate 400 and the second floating diffusion area connection node FDCN_2 of the second substrate 500 may contact each other. Therefore, the floating diffusion area FD disposed on the first substrate 400 may be connected to the gate SF of the amplification transistor SX disposed on the second substrate.

Figure 15:
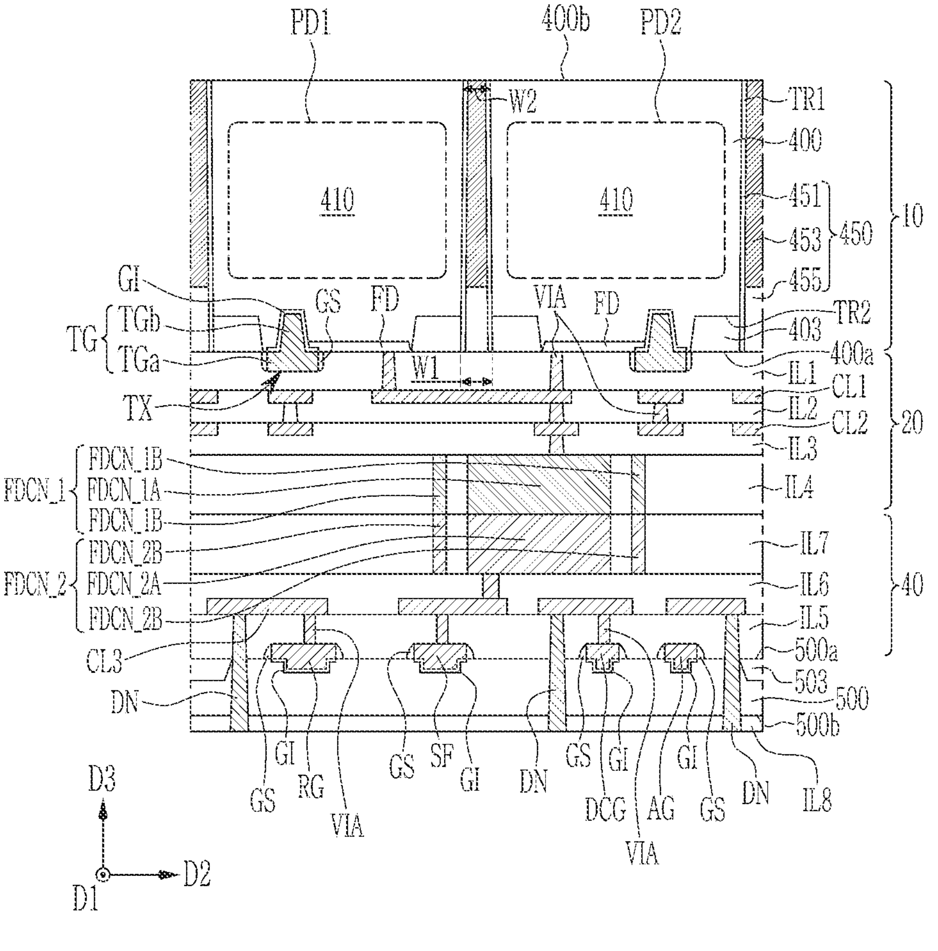

Next, referring to FIG. 15, the deep node DN is formed in the second substrate 500. In this case, the deep node may be formed in a direction that faces the first side 500*a* in the second side 500*b* of the second substrate 500. The deep node may be formed by forming the eighth insulation layer IL8 on the second side 500*b* of the second substrate 500, punching the eighth insulation layer IL8, the second substrate 500, and the fifth insulation layer IL5, and then filling with a metal material. Depending on implementations, the forming process of the eighth insulation layer IL8 may be omitted. The deep node DN may be formed to contact the third wiring layer CL3 disposed on the first side 500*a* of the second substrate 500. That is, in an etching process for forming the deep node DN, the third wiring layer CL3 may act as an etch stopper. After drilling a hole in the eighth insulation layer IL8, the second substrate 500, and the fifth insulation layer IL5 to reach the third wiring layer CL3, the hole may be filled with a metal such that the deep node DN can be formed.

Figure 16:
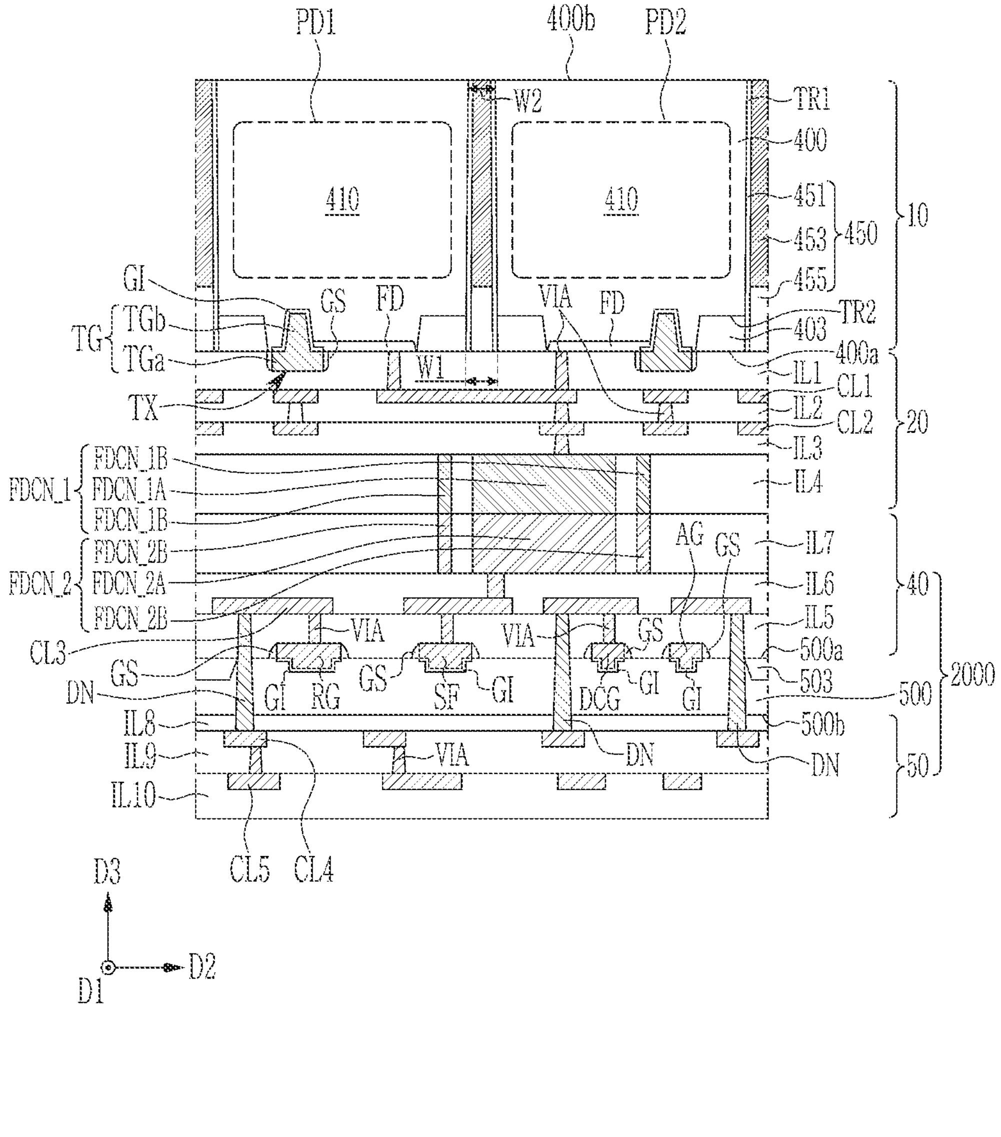

Next, referring to FIG. 16, the ninth insulation layer IL9, the tenth insulation layer IL10, the fourth wiring layer CL4, the fifth wiring layer CL5, and the via VIA may be formed on the second side 500*b* of the second substrate 500.

Figure 17:
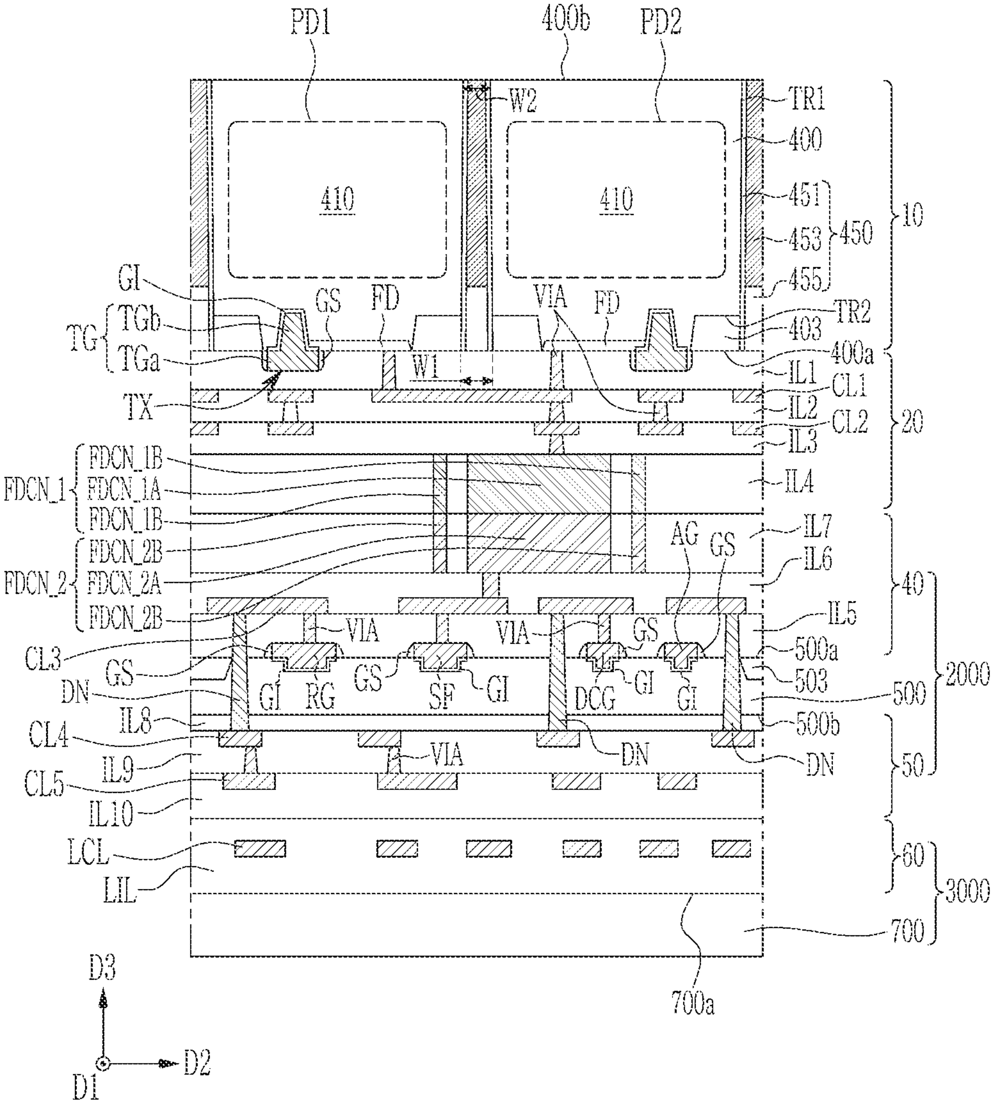
Figure 18:
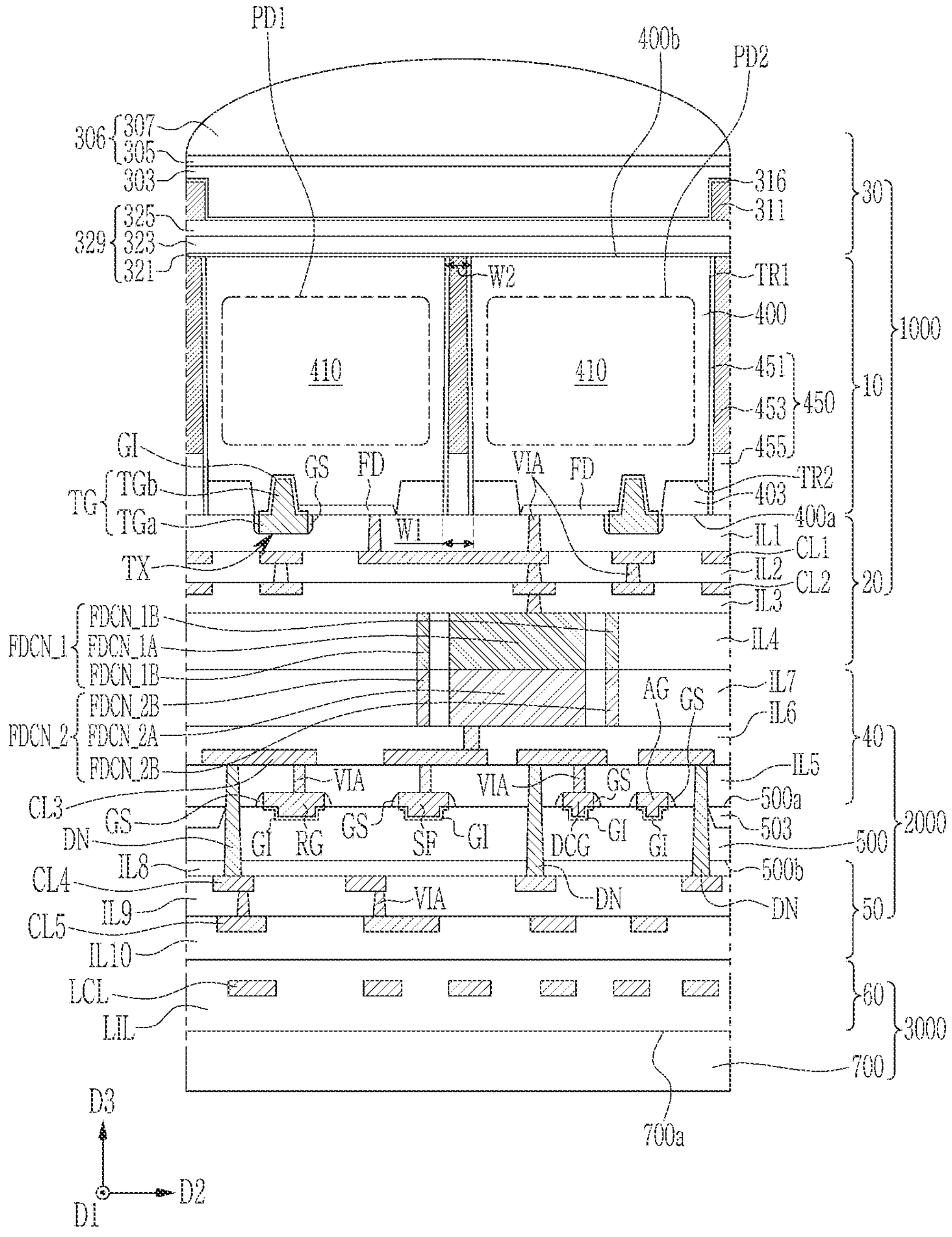

Next, referring to FIG. 17, the third chip 3000 including the third substrate 700 and the fourth wiring area 60 may be bonded to the second side 500*b* of the second substrate 500. Then, referring to FIG. 18, the light transmission layer 30 may be formed on the second side 400*b* of the first substrate 400. The description of the light transmission layer 30 is omitted as it is the same as described above. The manufacturing method described with reference to FIG. 12 to FIG. 18 is an example, and a specific manufacturing sequence may be different except for the process of forming the deep node DN from the second side 500*b* to the first side 500*a* of the second substrate 500.

In the previously described implementations, the third wiring layer CL3 is disposed on the first side 500*a* of the second substrate 500 and the fourth wiring layer CL4 and the fifth wiring layer CL5 are disposed on the first side 500*a*, but the present disclosure is not limited thereto. In some implementations, the third wiring layer CL3 and the fourth wiring layer CL4 may be disposed on the first side 500*a* of the second substrate 500 and the fifth wiring layer CL5 may be disposed on the first side 500*a*.

Figure 19:
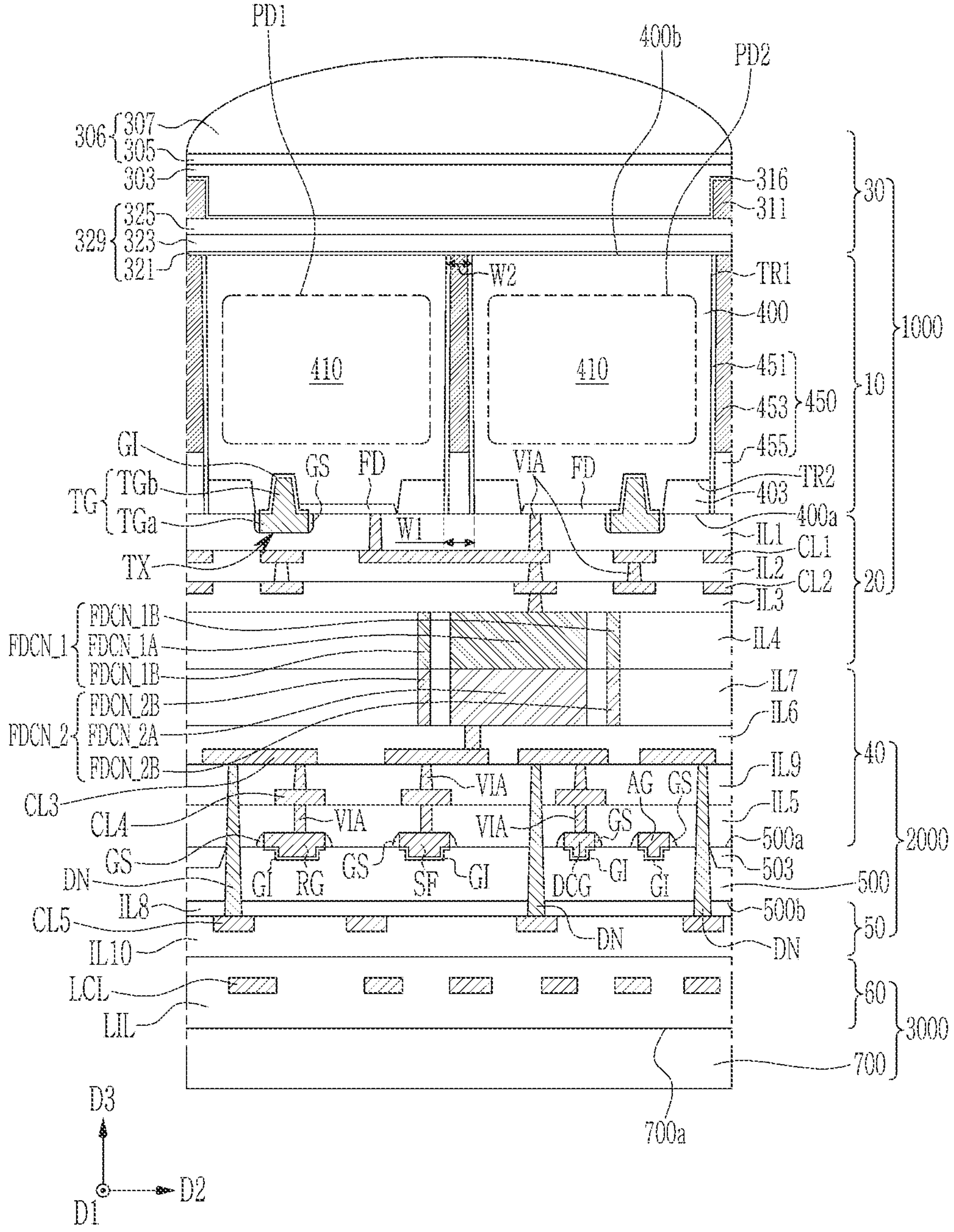
FIG. 19 illustrates an example image sensor.

FIG. 19 illustrates an example image sensor. Referring to FIG. 19, an image sensor is the same as the image sensor according to the implementation of FIG. 4, except that a third wiring layer CL3 and a fourth wiring layer CL4 are disposed on a first side 500*a* and a fifth wiring layer CL5 is disposed on a second side 500*b*. A detailed description of the same constituent element is omitted. In FIG. 19, the fourth wiring layer CL4 and the ninth insulation layer IL9 may be disposed between the third wiring layer CL3 and the first side 500*a* of the second substrate 500. A wire of the fourth wiring layer CL4 may be connected to the third wiring layer CL3 through a vis VIA. A deep node DN may connect the third wiring layer CL3 and the fifth wiring layer CL5. Since the fifth wiring layer CL5 is disposed on the second side 500*b* even in FIG. 19, a distance between the first side 500*a* of the second substrate 500 and the first side 400*a* of the first substrate 400 is shortened. Therefore, a conversion gain CG can be improved. In addition, since a floating diffusion area FD and the fifth wiring layer CL5 are disposed with the second substrate 500 interposed therebetween, coupling between the floating diffusion area FD and the wire disposed on the fifth wiring layer CL5 can be minimized.

In addition, some of wires connected with transistors disposed on the second side 500*b* of the second substrate 500, that is, a reset transistor RX, a dual conversion transistor DCX, an amplification transistor SX, and a selection transistor AX may be disposed on the first side 500*a*, and some of the wires may be disposed on the second side 500*b*.

Figure 20:
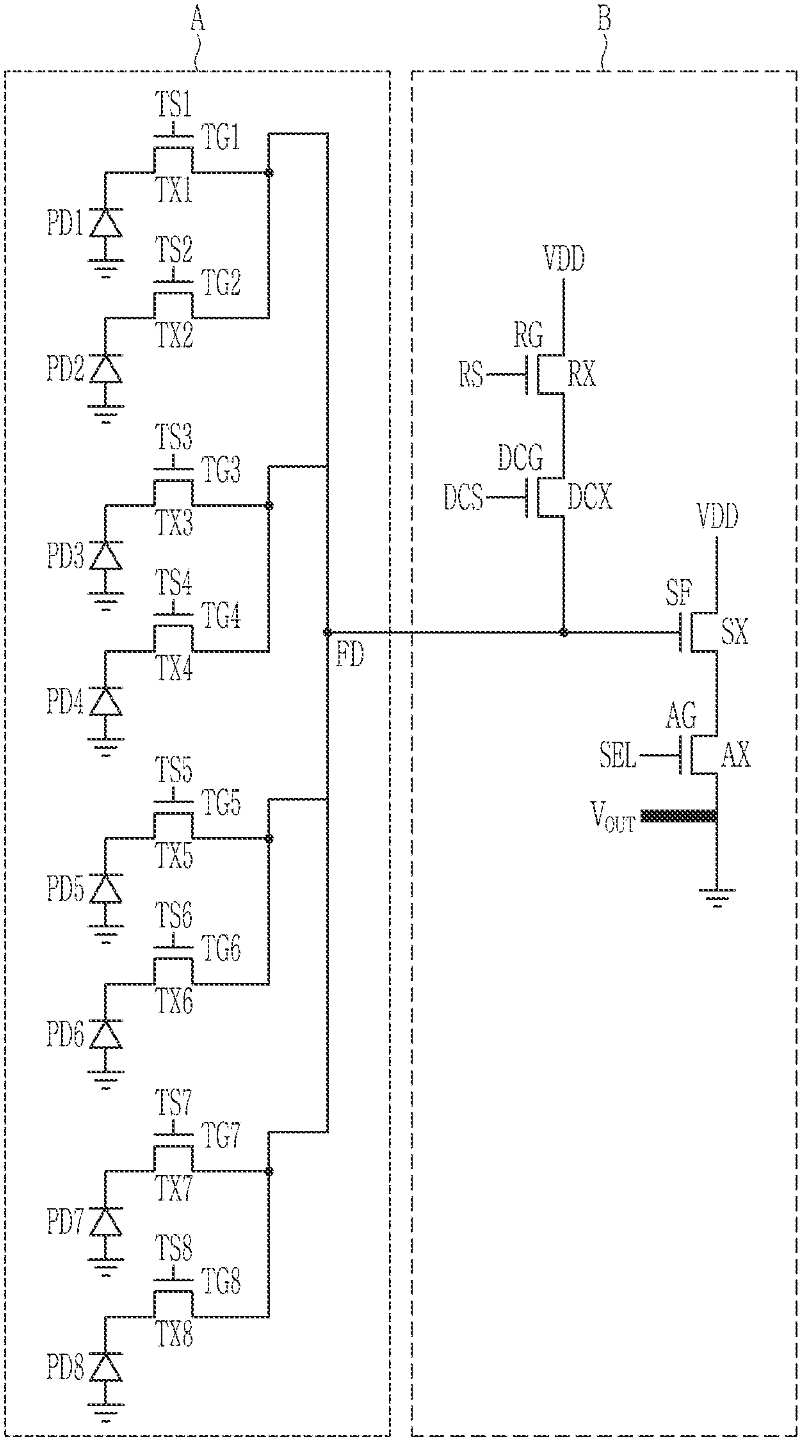
FIG. 20 illustrates the same circuit diagram of FIG. 2 with respect to an example image sensor.

FIG. 20 illustrates the same circuit diagram of FIG. 2 with respect to an example image sensor. In FIG. 20, a wire disposed on the second side 500*b* of the second substrate 500 is shown as a bonded line. As shown in FIG. 20, among wires connected with transistors disposed on the second substrate 500, an output wire Vout may be disposed on the second side 500*b* and other wires may be disposed on the first side 500*a*. However, FIG. 2 is just an example. An implementation in which, among the bolded lines in the circuit diagram of FIG. 2, one or more wires are disposed on the second side 500*b* of the second substrate 500 and other wires are disposed on the first side 500*a* is also included in the present disclosure.

Figure 21:
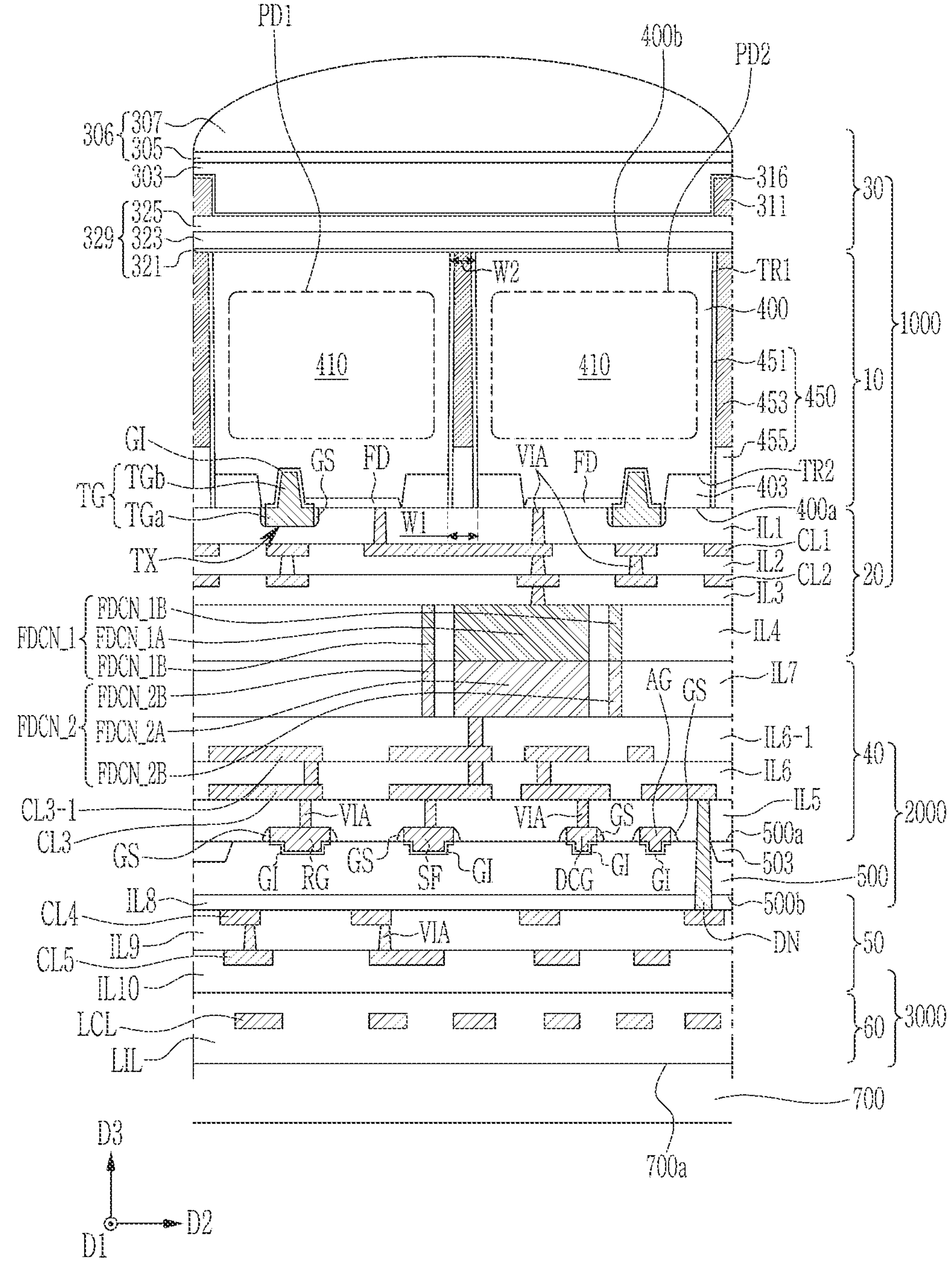
FIG. 21 illustrates the same cross-section of FIG. 4 with respect to an example image sensor.

FIG. 21 illustrates the same cross-section of FIG. 4 with respect to an example image sensor. Referring to FIG. 21, in an image sensor, a third wiring layer CL3 and a 3-1 wiring layer CL3-1 may be disposed on a first side 500*a* and a fourth wiring layer CL4 and a fifth wiring layer CL5 may be disposed on a second side 500*b*. The 3-1 wiring layer CL3-1 may be disposed within a 6-1 insulation layer IL6-1.

In the present implementation, some of wires connected with a reset transistor RX, a dual conversion transistor DCX, an amplification transistor SX, and a selection transistor AX may be disposed on the 3-1 wiring layer CL3-1 disposed on the first side 500*a* and some wires may be disposed on the fourth wiring layer CL4 disposed on the second side 500*b*. Simultaneously referring to FIG. 20 FIG. 21, the wire disposed on the fourth wiring layer CL4 may be an output wire Vout bolded in FIG. 20. This is a structure to solve a coupling problem between the output wire Vout and a floating diffusion area FD because this is the biggest problem.

However, this is only an example and the present disclosure is not limited thereto. Any implementation in which one or more of the wires shown in bold lines in FIG. 2 are disposed on the second side 500*b* of the second substrate 500 may be included in the present disclosure.

As described above, the image sensor and the manufacturing method of the image sensor includes a first substrate including a photoelectric conversion area and a second substrate including a transistor connected thereto, transistors and wires are disposed with the second substrate in between, and the transistor and wires are connected by a deep node that penetrates the second substrate. Therefore, the conversion gain can be increased by shortening the connected length of the floating diffusion area between the first substrate and the second substrate, and the coupling can be reduced as the floating diffusion area and wire are disposed while disposing the second substrate therebetween.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Although the implementations of the present disclosure have been described in detail above, the scope of the present disclosure is not limited thereto, and various modifications and improvements made by those skilled in the art using the basic concept of the present disclosure defined in the following claims are also included in the scope of the present disclosure that fall within the scope of the right.

What is claimed is:

1. An image sensor comprising:
a first substrate, wherein the first substrate includes a first side, a second side, and a photoelectric conversion area, the first side and the second side of the first substrate facing each other;
a transmission transistor disposed on the first side of the first substrate;
a second substrate, wherein the second substrate includes a first side and a second side facing each other;
a plurality of transistors disposed on the first side of the second substrate, wherein the plurality of transistors are connected with the transmission transistor;
a plurality of wires disposed on the second side of the second substrate; and
a deep node, wherein the deep node penetrates the second substrate,
wherein the first side of the first substrate and the first side of the second substrate face each other, and
wherein the plurality of transistors disposed on the first side of the second substrate and one or more wires of the plurality of wires disposed on the second side of the second substrate are connected through the deep node.

2. The image sensor of claim 1, further comprising a floating diffusion area disposed on the first substrate, wherein the floating diffusion area connects the transmission transistor to the plurality of transistors, and
wherein the plurality of transistors disposed on the second substrate comprise:
a reset transistor, wherein the reset transistor is configured to initialize the floating diffusion area;
an amplification transistor, wherein a gate of the amplification transistor is connected with the floating diffusion area; and
a selection transistor, wherein the selection transistor is connected with one end of the amplification transistor.

3. The image sensor of claim 2, wherein:
the plurality of wires includes an output wire connected to one end of the selection transistor, and
the output wire and the selection transistor are connected to each other through the deep node.

4. The image sensor of claim 2, wherein:
the plurality of wires includes a power voltage transmission wire connected with one end of the reset transistor, and
the power voltage transmission wire and the reset transistor are connected to each other through the deep node.

5. The image sensor of claim 2, wherein:
the plurality of wires includes a power voltage transmission wire connected to one end of the amplification transistor, and
the power voltage transmission wire and the amplification transistor are connected to each other through the deep node.

6. The image sensor of claim 2, wherein:
the plurality of wires includes a wire connected with a gate of the reset transistor, and
the gate of the reset transistor and the wire are connected to each other through the deep node.

7. The image sensor of claim 2, wherein:
the plurality of wires includes a wire connected with a gate of the selection transistor, and
the gate of the selection transistor and the wire are connected to each other through the deep node.

8. The image sensor of claim 2, further comprising a dual conversion transistor, wherein the dual conversion transistor connects the reset transistor to the floating diffusion area,
wherein the plurality of wires includes a wire connected with a gate of the dual conversion transistor, and
wherein the dual conversion transistor and the wire are connected to each other through the deep node.

9. The image sensor of claim 1, wherein:
a first end of the deep node extends from the first side of the second substrate, and
a second end of the deep node extends from the second side of the second substrate.

10. The image sensor of claim 1, further comprising a first floating diffusion area connection node disposed on the first substrate,
wherein the image sensor comprises a plurality of pixels,
wherein one pixel of the plurality of pixels includes eight photoelectric conversion area and eight transmission transistors, and
wherein the eight transmission transistors are connected with the first floating diffusion area connection node.

11. An image sensor comprising:
a first substrate, wherein the first substrate includes a first side, a second side, and a photoelectric conversion area, the first side and the second side of the first substrate facing each other;
a light transmission layer disposed on the second side of the first substrate;
a transmission transistor disposed on the first side of the first substrate;
a first wiring area disposed on the first side of the first substrate;
a second substrate, wherein the second substrate includes a first side and a second side facing each other;
a plurality of transistors disposed on the first side of the second substrate, wherein the plurality of transistors are connected with the transmission transistor;
a second wiring area disposed on the second substrate;
a third wiring area disposed on the second side of the second substrate; and
a deep node, wherein the deep node penetrates the second substrate,
wherein the first side of the first substrate and the first side of the second substrate face each other, and
wherein part of a plurality of wirings disposed in the second wiring area and part of a plurality of wirings disposed in the third wiring area are connected through the deep node.

12. The image sensor of claim 11, wherein:
a first end of the deep node extends from the first side of the second substrate, and
a second end of the deep node extends from the second side of the second substrate.

13. The image sensor of claim 11, further comprising a third substrate, wherein the third substrate includes a first side and a second side facing each other,
wherein the first side of the third substrate faces the second side of the second substrate, and
wherein the image sensor further comprises a plurality of transistors and a fourth wiring area, the plurality of transistors disposed on the first side of the third substrate and the fourth wiring area disposed on the first side of the third substrate.

14. The image sensor of claim 11, wherein:

a signal transmitted to a wire disposed in the third wiring area is transmitted to the plurality of transistors disposed in the first side of the second substrate through the deep node and a wire disposed in the second wiring area.

15. A manufacturing method of an image sensor, comprising:

preparing a first substrate, wherein the first substrate includes a first side, a second side, and a transmission transistor, the first side and the second side of the first substrate facing each other and a first wiring area disposed on the first side of the first substrate;

preparing a second substrate, wherein the second substrate includes a first side, a second side, and a plurality of transistors, the first side and the second side of the second substrate facing each other and a second wiring area disposed on the first side of the second substrate;

bonding the first substrate and the second substrate such that the first side of the first substrate and the first side of the second substrate face each other;

forming a deep node, wherein the deep node penetrates the second substrate in a direction facing the first side of the second substrate from the second side of the second substrate; and forming a third wiring area on the second side of the second substrate, wherein part of a plurality of wirings disposed in the second wiring area and part of a plurality of wirings disposed in the third wiring area connected with each other through the deep node.

16. The manufacturing method of the image sensor of claim 15, wherein:

a first end of the deep node extends from the first side of the second substrate, and a second end of the deep node extends from the second side of the second substrate.

17. The manufacturing method of the image sensor of claim 15, wherein:

a wire disposed in the second wiring area serves as an etch stopper when forming the deep node.

18. The manufacturing method of the image sensor of claim 15, further comprising:

preparing a third substrate, wherein the third substrate includes a first side, a second side, and a plurality of transistors, the first side and the second side of the third substrate facing each other and a fourth wiring area disposed on the first side of the third substrate; and bonding the second side of the second substrate and the first side of the third substrate to face each other.

19. The manufacturing method of the image sensor of claim 15, wherein:

the first substrate further comprises a photoelectric conversion area and a floating diffusion area connecting the transmission transistor to the plurality of transistors, and the plurality of transistors disposed on the second substrate include:

a reset transistor, wherein the reset transistor initializes the floating diffusion area;

an amplification transistor, wherein a gate of the amplification transistor is connected with the floating diffusion area; and a selection transistor, wherein the selection transistor is connected with one end of the amplification transistor, and wherein one or more wires connected with the reset transistor, the amplification transistor, and the selection transistor are formed in the third wiring area.

20. The manufacturing method of the image sensor of claim 15, wherein the image sensor further comprises a first floating diffusion area connection node disposed in the first wiring area, wherein a second floating diffusion area connection node is connected in the second wiring area, and wherein the first floating diffusion area connection node and the second floating diffusion area connection node directly contact each other when bonding the first substrate and the second substrate.

* * * * *